United States Patent
Dutta et al.

(10) Patent No.: US 6,349,403 B1
(45) Date of Patent: Feb. 19, 2002

(54) INTERATIVE, GRIDLESS, COST-BASED LAYER ASSIGNMENT COARSE ROUTER FOR COMPUTER CONTROLLED IC DESIGN

(75) Inventors: Shiraj Robi Dutta, Fremont; Pravin K. Madhani, Cupertino; Ashok Vittal, San Jose; Nagaraja Ravindranath Rao, Redwood City, all of CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 09/216,383

(22) Filed: Dec. 18, 1998

(51) Int. Cl.[7] ............................................... G06F 17/50
(52) U.S. Cl. .......................................... 716/12; 716/13
(58) Field of Search .............................. 716/1, 2, 6, 12, 716/13, 14, 15

(56) References Cited

U.S. PATENT DOCUMENTS

| | | | | |
|---|---|---|---|---|
| 4,495,559 A | * | 1/1985 | Gelatt, Jr. et al. | 364/148 |
| 4,811,237 A | * | 3/1989 | Putatunda et al. | 364/491 |
| 5,160,855 A | | 11/1992 | Dobberpuhl | 307/270 |
| 5,550,748 A | | 8/1996 | Xiong | 364/488 |
| 5,671,432 A | | 9/1997 | Bertolet et al. | 395/800 |
| 5,729,466 A | | 3/1998 | Bamji | 364/488 |
| 5,784,289 A | * | 7/1998 | Wang | 364/490 |

OTHER PUBLICATIONS

Arnold et al., "An Interactive Maze Router with Hints," 25th ACM/IEEE Design Automation Conf., pp 672–676, 1988.*
Lucas et al., "An Efficient Routing System for Block Layout", Maple Press, pp. 398–401, 1988.*
Sato et al., "A Hardware Implementation of Gridless Routing Based on Content Addressable Memory," 27th ACM/IEEE Design Automation Conf., pp 646–649, 1990.*
Schiele et al., "A Gridless Router for Industrial Design Rules," 27th ACM/IEEE Design Automation Conf., pp626–631, 1990.*
Sehgal et al., "A Gridless Multi–Layer Area Router," IEEE, pp158–161, 1994.*

* cited by examiner

Primary Examiner—Matthew Smith
Assistant Examiner—Leigh Marie Garbowski
(74) Attorney, Agent, or Firm—Wagner, Murabito & Hao LLP

(57) ABSTRACT

An efficient, gridless, cost-based coarse router having layer assignment for a computer controlled integrated circuit design. The coarse routing process is used during the wire routing phase of an integrated circuit design and fabrication process. During the coarse wire routing process, a number of obstructions are defined. Next, the horizontal and vertical passages between adjacent obstructions, through which wires may be routed, are determined. The costs for possible wire paths connecting a pair of pins are computed based upon wire density histograms associated with the various passages through which the paths traverse. The lowest cost path is then selected. In order to increase the processing speed, a pruning method is employed to minimize the number of possible paths to be considered. In some instances, there may be areas which are overly congested. For overly congested areas, a pseudo obstruction is artificially created by the coarse router. Thereby, it may be more cost effective to route a portion of the wire through multiple different metal layers. The histogram is then updated and the next wire is iteratively routed.

24 Claims, 25 Drawing Sheets

INTERATIVE, GRIDLESS, COST-BASED LAYER ASSIGNMENT COARSE ROUTER FOR COMPUTER CONTROLLED IC DESIGN

BACKGROUND OF THE INVENTION

1. Field of the Invention

The present invention relates to the field of electronic design automation (EDA). More specifically, the present invention relates to wire routing within the field of electronic design automation used in the design and fabrication of integrated circuit devices.

2. Related Art

The rapid growth of the complexity of modern electronic circuits has forced electronic circuit designers to rely upon computer programs to assist and automate most steps of the circuit design process. Typical circuits today contain hundreds of thousands or millions of individual pieces or "cells." Such a design is much too large for a circuit designer or even an engineering team of designers to manage effectively manually. To automate the circuit design and fabrication of integrated circuit devices, electronic design automation (EDA) systems have been developed.

An EDA system is a computer software system designers use for designing integrated circuit (IC) devices. The EDA system typically receives one or more high level behavioral descriptions of an IC device (e.g., in HDL languages like VHDL, Verilog, etc.) and translates this high level design language description into netlists of various levels of abstraction. At a higher level of abstraction, a generic netlist is typically produced based on technology independent primitives. The generic netlist can be translated by the EDA system into a lower level technology-specific netlist based on a technology-specific library that has gate-specific models for timing and power estimation.

A netlist describes the IC design and is composed of nodes (elements) and edges, e.g., connections between nodes, and can be represented using a directed cyclic graph structure having nodes which are connected to each other with signal lines. The netlist is typically stored in computer readable media within the EDA system and processed and verified using many well known techniques. One result is a physical device layout in mask form which can be used to directly implement structures in silicon to realize the physical IC device.

More specifically, within a typical EDA system, the circuit designer first produces a high-level description of the circuit in a hardware description language such as Verilog or VHDL. This high-level description is converted into a netlist using a computer implemented synthesis process such as a the "Design Compiler" by Synopsys of Mountain View, Calif. A netlist is a description of the electronic circuit which specifies what cells compose the circuit and which pins of which cells are to be connected together using wires ("nets"). Importantly, the netlist does not specify where on a circuit board or silicon chip the cells are placed or where the wires run which connect them together. Determining this geometric information is the function of a computer controlled placement process and a computer controlled routing process.

The placement process finds a location for each cell on a circuit board or silicon chip. The locations are specified, typically, in two dimensional spatial coordinates, e.g., (x, y) coordinates, on the circuit board or silicon chip. The locations are typically selected to optimize certain objectives such as wire length, wire routablility, circuit speed, circuit power consumption, and/or other criteria, subject to the condition that the cells are spread evenly over the circuit board or silicon chip and that the cells do not overlap with each other. The output of the automatic computer controlled cell placement process includes a data structure including the (x, y) location for each cell of the IC design.

Next, the designer supplies the netlist and the cell location data structure, generated by the placement program, to a computer implemented automatic wire routing process ("router"). The router generates wire geometry within data structure for connecting pins together. The wire geometry data structure and cell placement data structure together are used to make the final geometric database needed for fabrication of the circuit. Routers typically include a course routing process and a fine routing process. The coarse router provides a general path for the routing that is done at the detail stage. The coarse router examines at the level of the whole integrated circuit chip and its available resources and determines what the rough pathways should be from a topological standpoint. The fine or detail router lays down the actual geometries and connected wire segments in the appropriate layers as a wire connection may span multiple layers. The fine router creates wire routes that are "clean," e.g., do not have design rule violations, do not overlap other structures and can be fabricated.

FIG. 1 illustrates a layout configuration 10 used in a typical grid-based router. Within a grid-based router, wires are routed along defined and equally spaced grid lines of a grid array. Horizontal 30 and vertical 32 grid lines are shown for an exemplary grid array of layout 10. To route wires between a source pin and a target (e.g., destination) pin, the grid lines must be used in a grid-based router. For instance, wire route 18 that couples pins on block 12 and 14 utilizes, and is aligned with, the horizontal and vertical grid lines. Grid lines of the grid array are used in the routing process to speed up the process of finding the wire routing solutions by reducing the number of pathways to consider for routing. However, the grid-based router approach also has several disadvantages which are described below.

One disadvantage of grid-based routers is that they have trouble routing with circuit blocks that do not use a single defined grid array, as is common in today's complex circuit implementations. Modern integrated circuit designs (e.g., "system-on-a-chip" designs) typically include several custom integrated circuit designs that are implemented by different companies. Therefore, these custom designs may or may not use the same grid array dimensions as used by the layout 10 of FIG. 1. Further, hand-designed integrated circuits, like circuit 16, may not even use any grid array at all. For instance, pins 4 and pins 6 of the custom designs 12 and 14, respectively, do not align with the grid array of grid lines 30 and 32 because these circuit blocks use a different dimension grid array. This causes a problem for the grid-based router because pins 6 and 4 do not match the grid array of layout 10 and special time consuming attention needs to be paid to these pins. In some cases, the grid-based router does not have any mechanism for dealing with pins that do not align with the main grid array.

Another disadvantage of grid-based routing is that the routing problem is not really a grid-based problem to begin with. In a grid-based router, the grid array is used to locate minimum cost wire routes. However, wire routing really depends on wire length, wire width and wire separation, not a predefined wire grid array. Wire length and wire geometry dictate signal delay which is an ever increasingly large consideration in modern sub-micron designs. To reduce delay, the wires can be made wider and can be separated a greater distance from each other. Therefore, forcing wires to lie on predefined grid lines does not really address the greater underlying problem of signal delay.

Another disadvantage of grid-based routing is that it tends to waste a large percentage of routable area within an integrated circuit substrate. For instance, consider wire route 20 between block 14 and block 16. This route 20, as shown, is located between grid lines 32b and 32a. If this route 20 were made in the grid array it would consume (e.g., occupy) both of the adjacent grid lines 32b and 32a, even though there is room to run other wires between these grids lines and wire route 20. In a grid-based router, when adjacent grid lines are occupied, it is not possible to route a wire there though even though there might be room for such.

Accordingly, what is needed is a routing process that does not have the disadvantageous associated with the grid-based routing process described above. What is needed further is a routing process that is efficient and does not require a relatively long time to complete. What is further needed is a routing process that produces design rule clean wire routes. The present invention provides these advantageous. These and other advantages of the present invention not specifically mentioned above will become clear within discussions of the present invention presented herein.

SUMMARY OF THE INVENTION

The present invention pertains to an efficient, gridless, cost-based coarse router having layer assignment for a computer controlled integrated circuit design. The coarse routing process is used during the wire routing phase of an integrated circuit design and fabrication process. During the coarse wire routing process, a number of obstructions are defined. Next, the horizontal and vertical passages between adjacent obstructions, through which wires may be routed, are determined. The costs for possible wire paths connecting a pair of pins are computed based upon wire density histograms associated with the various passages through which the paths traverse. The most cost effective path is then selected. In order to increase the processing speed, the present invention performs several pruning and optimization heuristics that are directed to provide a good clean wire route without necessarily wasting effort locating the lowest cost solution. In some instances, there may be areas which are overly congested. For overly congested areas, a pseudo obstruction is artificially created by the coarse router. Thereby, it may be more cost effective to route a portion of the wire through multiple different metal layers. The histogram is then updated and the next wire is iteratively routed.

DETAILED DESCRIPTION OF THE INVENTION

Figure 1:
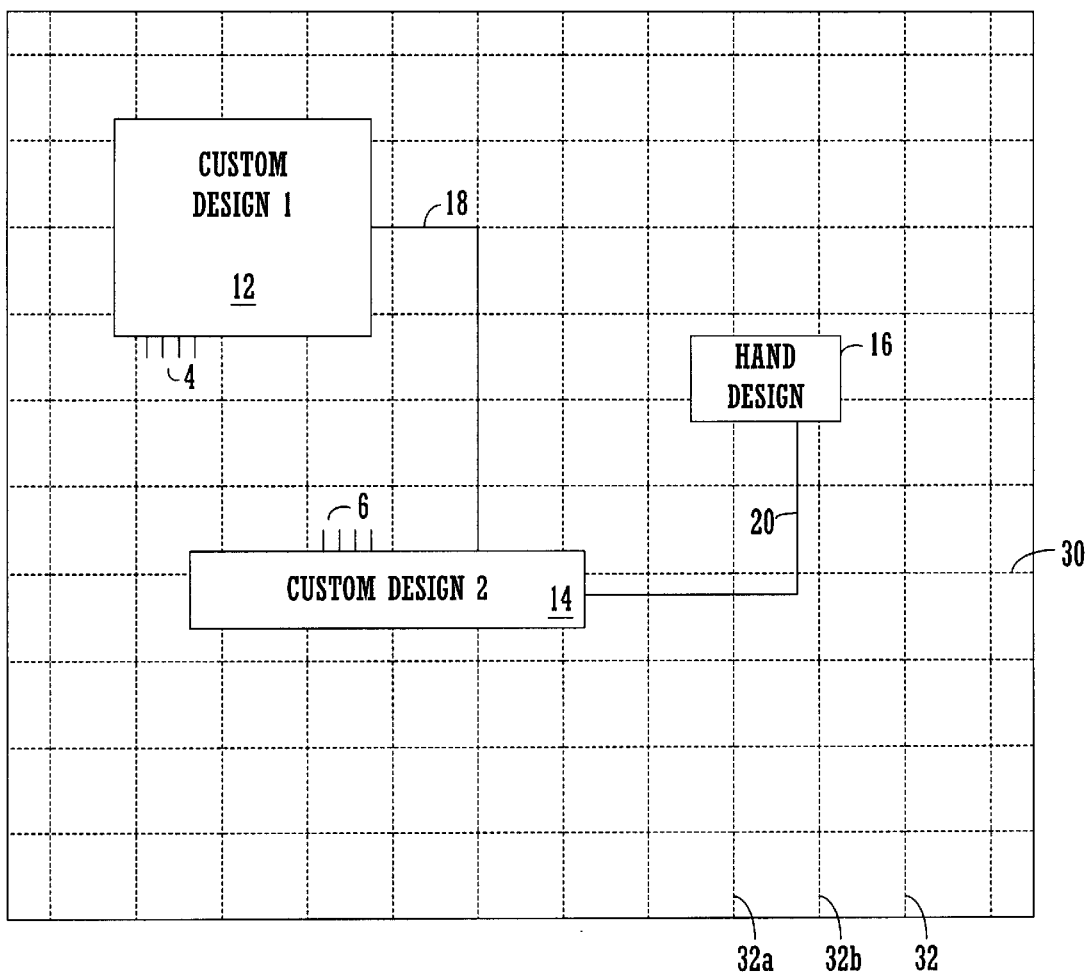
FIG. 1 illustrates a prior art grid-based layout used by a prior art grid-based routing process.

In the following detailed description of the present invention, an efficient iterative, gridless, cost-based fine routing process, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

NOTATION AND NOMENCLATURE

Some portions of the detailed descriptions which follow are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "translating" or "calculating" or "determining" or "displaying" or "recognizing" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

COMPUTER SYSTEM PLATFORM 112

Aspects of the present invention, described below, are discussed in terms of steps executed on a computer system (e.g., wire routing processes 300 and 310 and processes 418 and 424). These steps are implemented as program code stored in computer readable memory units of a computer system and are executed by the processor of the computer system. Although a variety of different computer systems can be used with the present invention, an exemplary general purpose computer system 112 is shown in FIG. 2.

Figure 2:
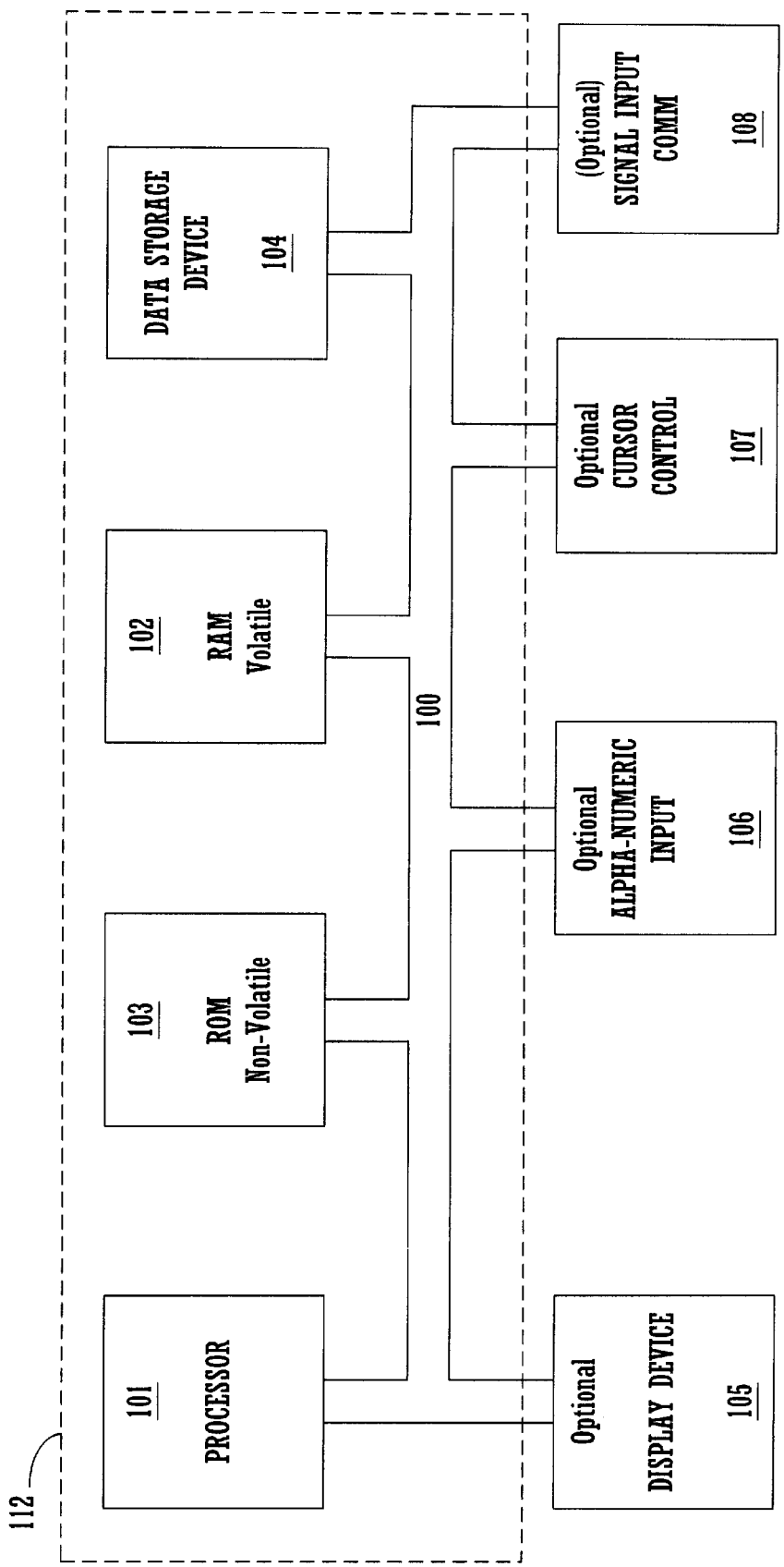
FIG. 2 is a block diagram of a general purpose computer system operable as a platform for the embodiments of the routing process of the present invention.

In general, computer system 112 of FIG. 2 includes an address/data bus 100 for communicating information, a central processor 101 coupled with the bus for processing information and instructions, a volatile memory 102 (e.g., random access memory RAM) coupled with the bus 100 for storing information and instructions for the central processor 101 and a non-volatile memory 103 (e.g., read only memory ROM) coupled with the bus 100 for storing static information and instructions for the processor 101. Computer system 112 also includes a data storage device 104 ("disk subsystem") such as a magnetic or optical disk and disk drive coupled with the bus 100 for storing information and instructions and a display device 105 coupled to the bus 100 for displaying information to the computer user. Data storage device 104 can include one or more removable magnetic or optical storage media (e.g., diskettes, tapes) which are computer readable memories. Memory units of computer system 112 include 102, 103 and 104.

Also included in computer system 112 of FIG. 2 is an alphanumeric input device 106 including alphanumeric and function keys coupled to the bus 100 for communicating information and command selections to the central processor 101. Computer system 112 also includes an optional cursor control or directing device 107 coupled to the bus for communicating user input information and command selections to the central processor 101. Computer system 112 can also include an optional signal generating device 108 coupled to the bus 100 for interfacing with other networked computer systems. The display device 105 utilized with the computer system 112 of the present invention may be a liquid crystal device, other flat panel display, cathode ray tube, or other display device suitable for creating graphic images and alphanumeric characters on a display screen and recognizable to the user.

The present embodiment of the present invention utilizes an iterative, gridless cost-based routing process for determining good routes between a source pin (the "source") and a target pin (the "target"). The routing process (e.g., the "router") is gridless in that a grid array of predefined equally spaced horizontal and vertical lines is not used for routing the wire connections between the source and the target. Rather, escape lanes are used for routing wire connections and the lanes are based on the boundaries (e.g., the edges) of obstructions within the layout. The router of the present invention is cost-based in that it utilizes a cost computation in determining the cost of a particular route or path between the source and the destination cost computations are used in selecting an appropriate route from among a number of possible paths. Lastly, the router is iterative in that many passes through the path determination process are used so that poorly routed wire connections can be re-routed (e.g., with lower costs) on subsequent passes (e.g., iterations). The subsequent passes allow the router of the present invention, when routing a given connection, to take into consideration the cost impact on that connection from other routes that are already laid down.

Iterative Routing Mechanism. The router of the present invention is iterative in that all source/target pairs are routed, and then routed again, however, through each iteration, the source/target pairs are sequentially processed (see FIG. 5A). During the sequential process for a given iteration, the router of the present invention ignores the potential effects of the current source/target pair route on other routes not yet made. An example of the iterative routing mechanism of the present invention is described below.

Figure 3A:
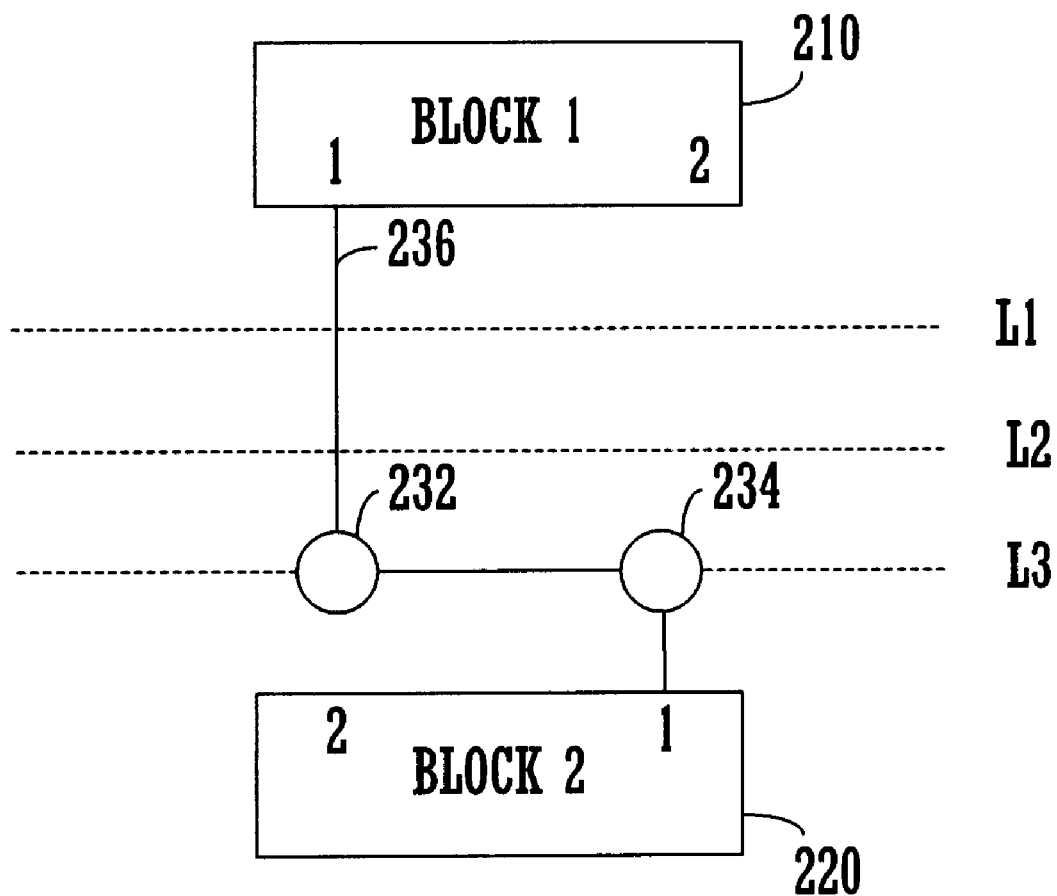
FIG. 3A is a diagram of a first wire route between a source pin and a target pin of a first circuit block and a second circuit block, respectively, where orthogonal wires are assumed to be on adjacent layers.

In FIG. 3A, two circuit blocks are shown 210 and 220 and they exist in a first layer. Circuit block 210 contains a pin "1" of a first net and a pin "2" of a second net. Circuit block 220 contains a pin "1" of the first net and a pin "2" of the second net. Between the circuit blocks are three possible horizontal lanes, L1, L2 and L3, in the second layer for routing connections in the horizontal direction. Lane L1 is based on object 210 and lane L3 is based on object 220. For simplicity, the object defining lane L2 is not shown. In this example, vertical lanes are run in the first layer. During the first iteration of the routing process, path 236 is made including a first layer path segment from pin "1" of block 210 to via 232, down to the second layer, across lane L3, to via 234 and up to the first layer and then to pin "1" of block 220. This path 236 does not leave an un-obstructed escape path for pin "2" of block 220 because the routing of the first net "1" does not take into consideration its impact on the route of the second net "2" because that route does not yet exist.

Figure 3B:
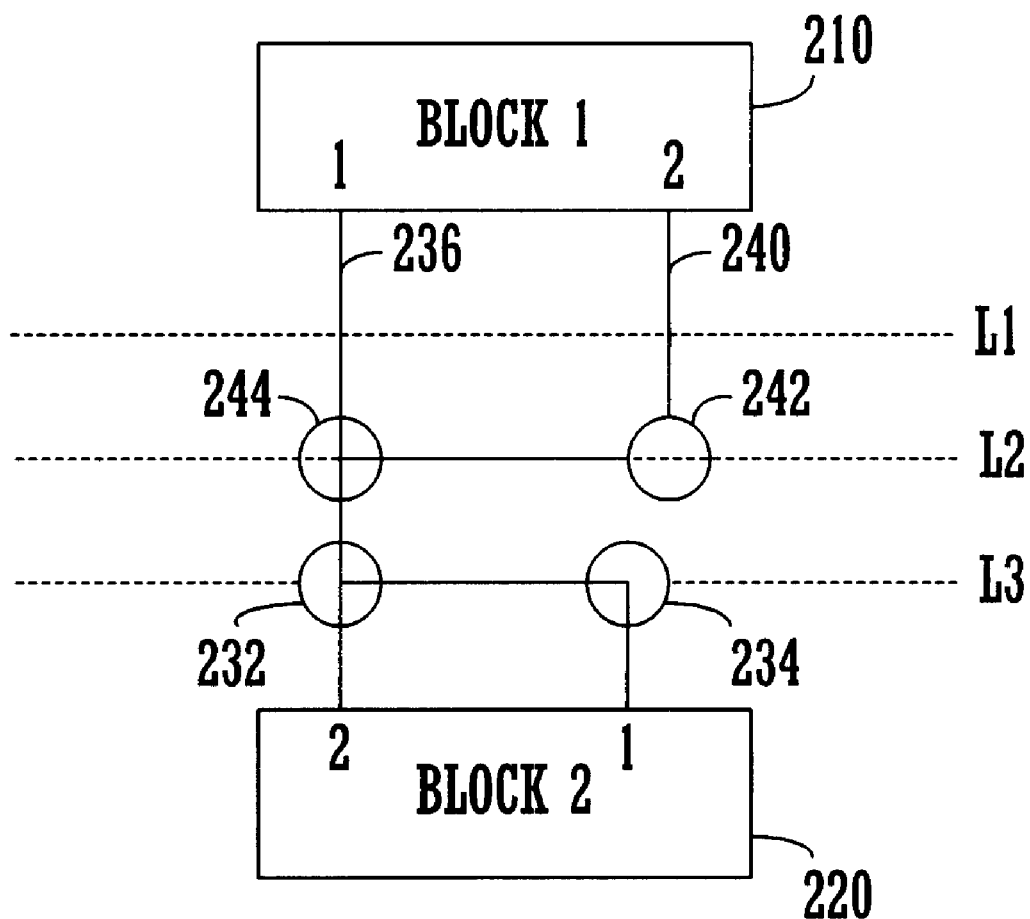
FIG. 3B is a diagram of a second wire route between a source pin and a target pin of a first circuit block and a second circuit block, respectively; the second wire route overlapping the first wire route of FIG. 3A.

FIG. 3B illustrates the second exemplary route of the first iteration of the routing process. During the first iteration, path 240 is made and it includes a first layer path segment from pin "2" of block 220 to via 244, down to the second layer, across lane L2, to via 242 and up to the first layer and then to pin "2" of block 210. This path 240 overlaps path 236 thereby increasing the cost of both paths. Wire routes are "soft" obstructions and therefore can overlap other wire connections. However, in the cost analysis, overlapping conditions receive a high cost value and should therefore be avoided. In this case, an overlap cannot be avoided. Wire routes within the present invention are not fixed objects and can be replaced by better (e.g., lower cost) routes. A second iterative pass through the routing process is then made so that paths can take into consideration, cost-wise, their impact on other existing wire routes.

Figure 3C:
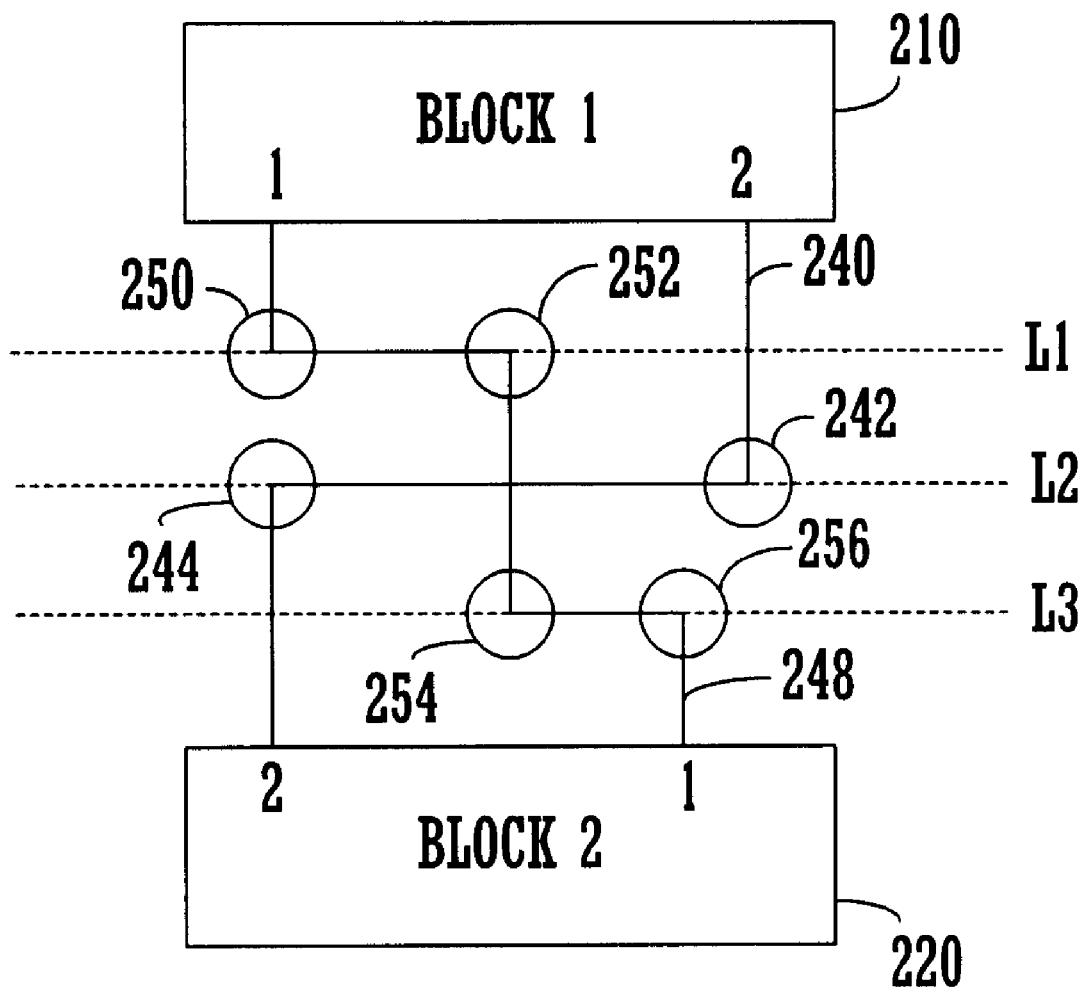
FIG. 3C is a diagram of a replaced first wire route between a source pin and a target pin of a first circuit block and a second circuit block, respectively; the replaced first wire route not overlapping the second wire route of FIG. 3B.

FIG. 3C illustrates the third exemplary route of the second iteration of the routing process. During the second iteration, path 236 is completely removed and a new route is determined in an effort to locate a lower cost route. Path 248 is then made including a first layer path segment from pin "1" of block 210 to via 250, down to the second layer, across lane L1, to via 252 to the first layer and then to via 254 back down to the second layer, across lane L3 to via 256, back Up to the first layer and then to pin "1" of block 220. By switching from layer to layer, path 248 does not overlap existing path 240 and therefore leads to a better routing configuration over FIG. 3B because wire overlaps carry a high cost factor. The routes of FIG. 3C are therefore clean. By performing the routing process in an iterative way, the present invention allows the path between the first net "1" to take into consideration its impact on the second net "2" and thereby adjust accordingly to realize a lower cost final routing final solution. Described below are the routing processes used by the present invention for determining paths between a source and a target.

Cost-Based Routing Mechanism. The router of the present invention is cost-based in that it determines the cost of potential paths from a source to a target and attempts to select a low cost solution among the determined paths. However, within the present invention, several optimizations are performed to speed up the routing process which also acts to prune certain available paths. Therefore, although the present invention yields a good routing solution for the pins of an integrated circuit layout, it may not yield, or even attempt to locate, the absolute lowest cost solution. In practice, the optimizations selected by the present invention have proven to locate good clean solutions while not consuming excessive processing time.

The cost formula for a given wire route, as used by embodiments of the present invention, includes three elements as shown below:

$$\text{Total Cost} = (\text{Cost1} \times \text{alpha1}) + (\text{Cost2} \times \text{alpha2}) + (\text{Cost3} \times \text{alpha3}) + (\text{Cost4} \times \text{alpha4})$$

where: Cost1 is based on the Manhattan Distance of the wire length from the source to the target; Cost2 is a per layer wire length cost that changes from layer to layer with some layers having higher cost than other layers; Cost3 is a penalty associated with overlaps of the route with soft obstructions. Within the present invention, different layers have different cost factors which are typically based on the relative conductivity and capacitance of the layers. Cost4 is the estimated cost, based on an optimistic path, to the target. Cost4 is described in more detail with respect to FIG. 11D. It is appreciated that via cost can also be added to the above cost computation.

The cost formula is a weighted sum of these three cost elements as shown by the three alpha terms. In one embodiment, overlaps are not wanted and therefore alpha3 is typically set relatively high so that the final routing solution avoids, where possible, any wire overlaps to yield a clean solution. It is appreciated that the above alpha values can be adjusted from one iteration to the next. In the process of determining possible paths between a source and a target, the present invention utilizes the above cost analysis to determine the cost of the path. As described more fully below, the total cost of the path may include a partial computed cost plus an estimated cost portion.

Figure 4:
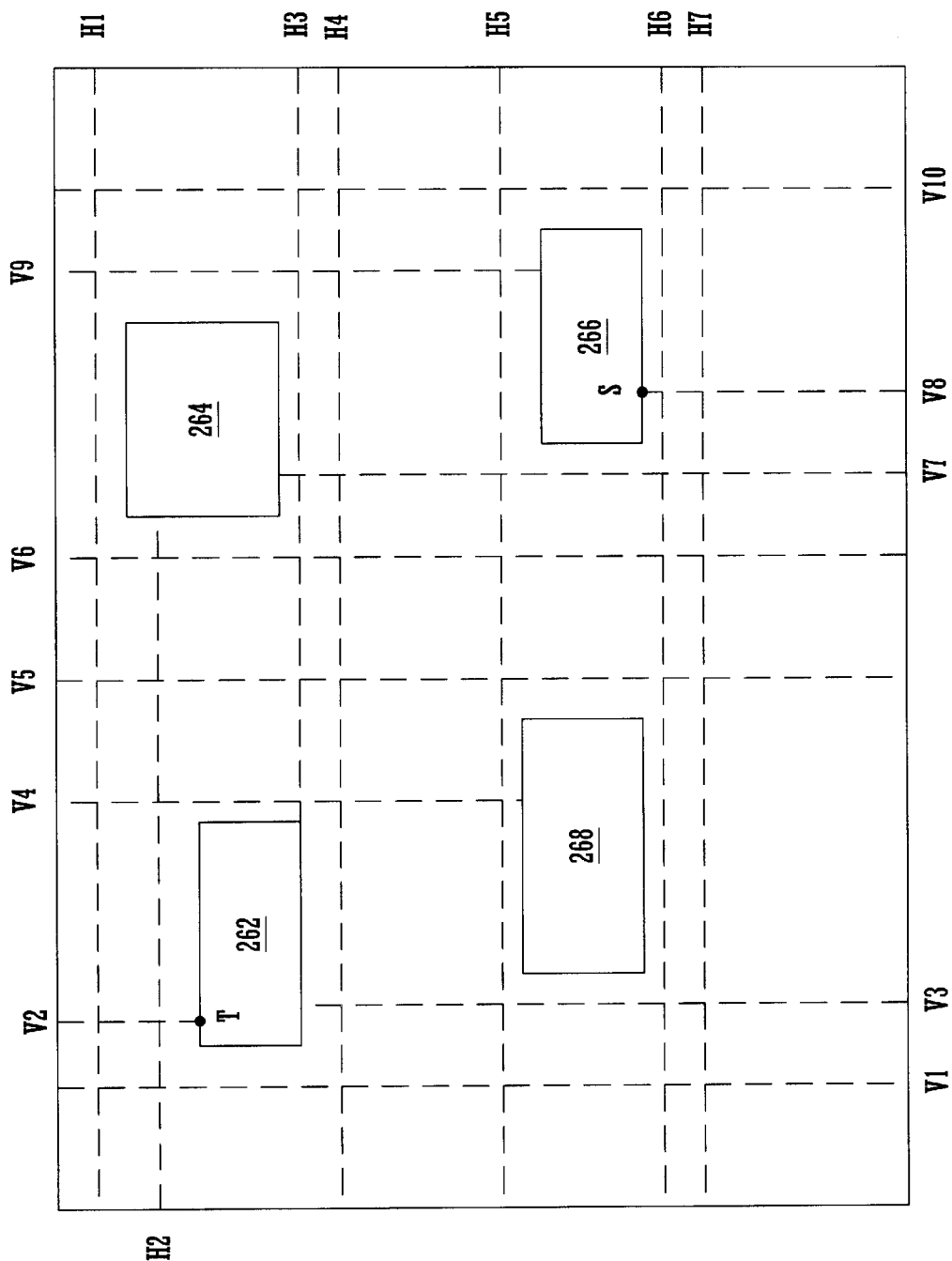
FIG. 4 is a diagram illustrating the layout of obstacles/blocks and lanes used within the gridless based router process of the present invention.

Gridless Routing Mechanism. The router of the present invention utilizes defined escape lanes ("lanes"), not grids, for routing wire connections between a source and a target within an integrated circuit layout. Therefore, a gridless routing mechanism is used. FIG. 4 illustrates an exemplary integrated circuit layout portion 260 having lanes. Layout portion 260 contains several obstructions (e.g., circuit blocks, etc.) 262, 264, 266 and 268 that do not allow the routing of wire connections there within. These are therefore "hard" obstructions. However, wire connections can be routed between and around the obstructions. For simplicity, all objects of FIG. 4 are assumed to be within a common layer.

Within the present invention, lanes are defined based on the boundaries (e.g., the edges) of the obstructions that exist within the layer of the lane. Each obstruction is modeled as a collection of rectangles having a number of sides each. In the exemplary case shown in FIG. 4, each obstruction is a rectangle having four sides or edges. Lanes are defined as lines that run parallel to the edges of the rectangles and are offset by required spacing plus half the wire width from these edges. A lane is used for routing wires and therefore is continuous and terminates at reaching a hard obstruction. Lanes may run over soft obstructions (e.g., an obstruction that can be routed over). Escape lanes are also defined based on the placement of a source pin and a target pin. A lane can be defined based on two or more obstructions if the edges of the obstructions lie within a common coordinate position (vertically or horizontally).

For instance, obstruction 262 of FIG. 4 defines lane V1, lane V4, lane H2 and lane H4. Target, "T," defines lane V2. Obstruction 266 defines lane V7, lane V10, lane H5 and land H6. Source "S," defines lane V8. Obstruction 264 defines lane V6, lane V9, lane H1 and land H3. Obstruction 268 defines lane V3, lane V5, lane H5 and land H7. Lane H5 is shared by obstruction 266 and obstruction 268 due to the alignment of their top edges. Within the routing processes of the present invention, paths between the source and the target are determined that lie on one of the lanes defined above. The single layer example shown in FIG. 4 is done for illustration only. In common practice multiple layers are typically used within a single integrated circuit layout with each layer having a preferred wiring direction (e.g., vertical or horizontal).

Figure 5A:
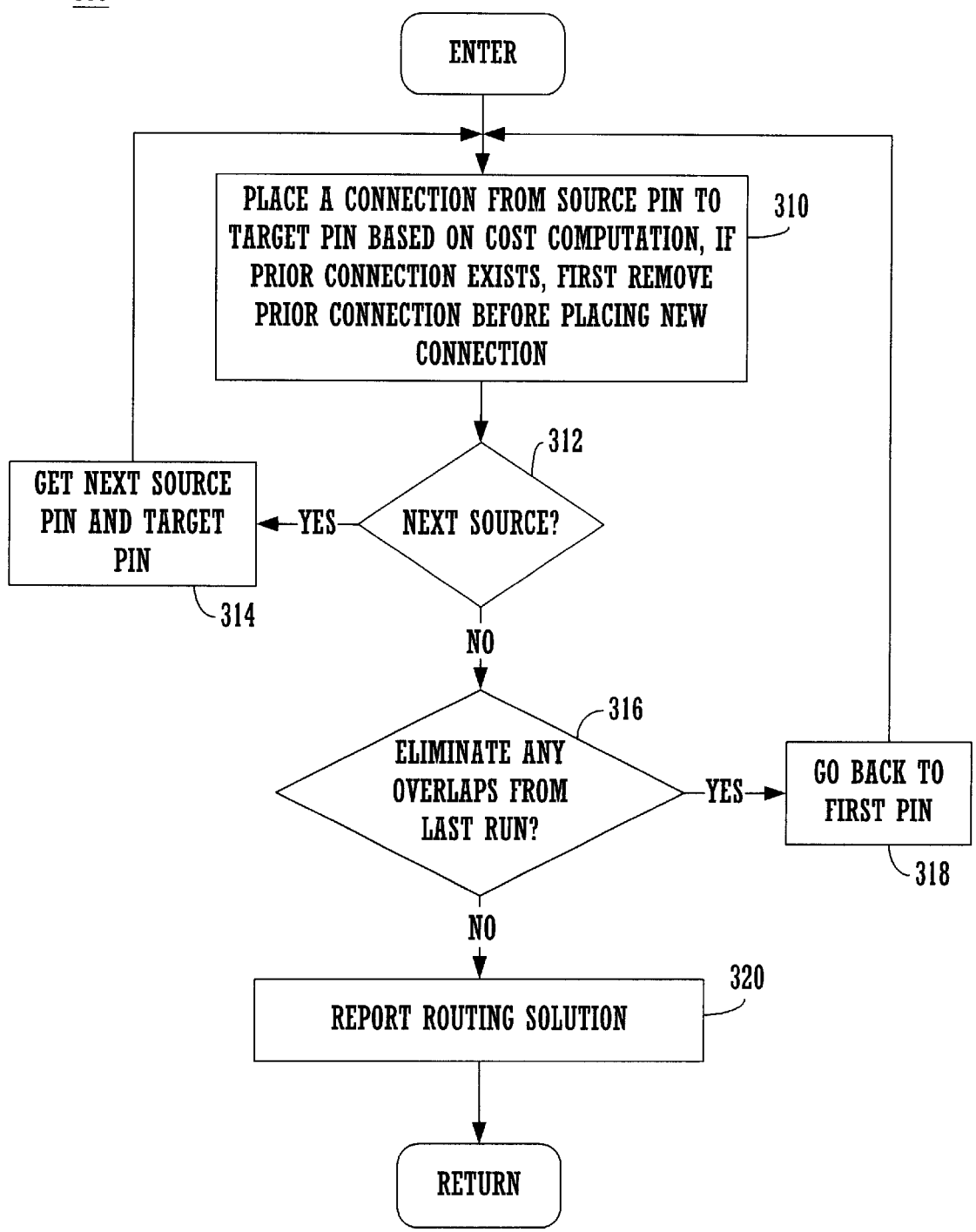
FIG. 5A is a flow chart illustrating steps within the iterative, gridless, cost-based routing process of the present invention.

Iterative Routing Process. FIG. 5A illustrates the iterative routing process 300 of one embodiment of the present invention. It is appreciated that process 300 is realized as instruction code stored in computer readable memory units of computer system 112 which are executed by processor 101. At step 310, a wire connection is routed between a source pin and a target pin of an input integrated circuit design. If the source and target pair already have a wire connection routed (e.g., from a prior iteration of step 310), then the prior route is ripped out and a new route is made. At step 310, selection of the wire route is performed from among a number of possible paths, with the lowest cost considered path being selected as the wire route. Due to certain optimization processes of the present invention, some available paths are pruned to reduce the number of considered paths. Step 310 tracks the number of routes that are not clean, e.g., that have some overlap with a soft object or with another route.

Figure 5B:
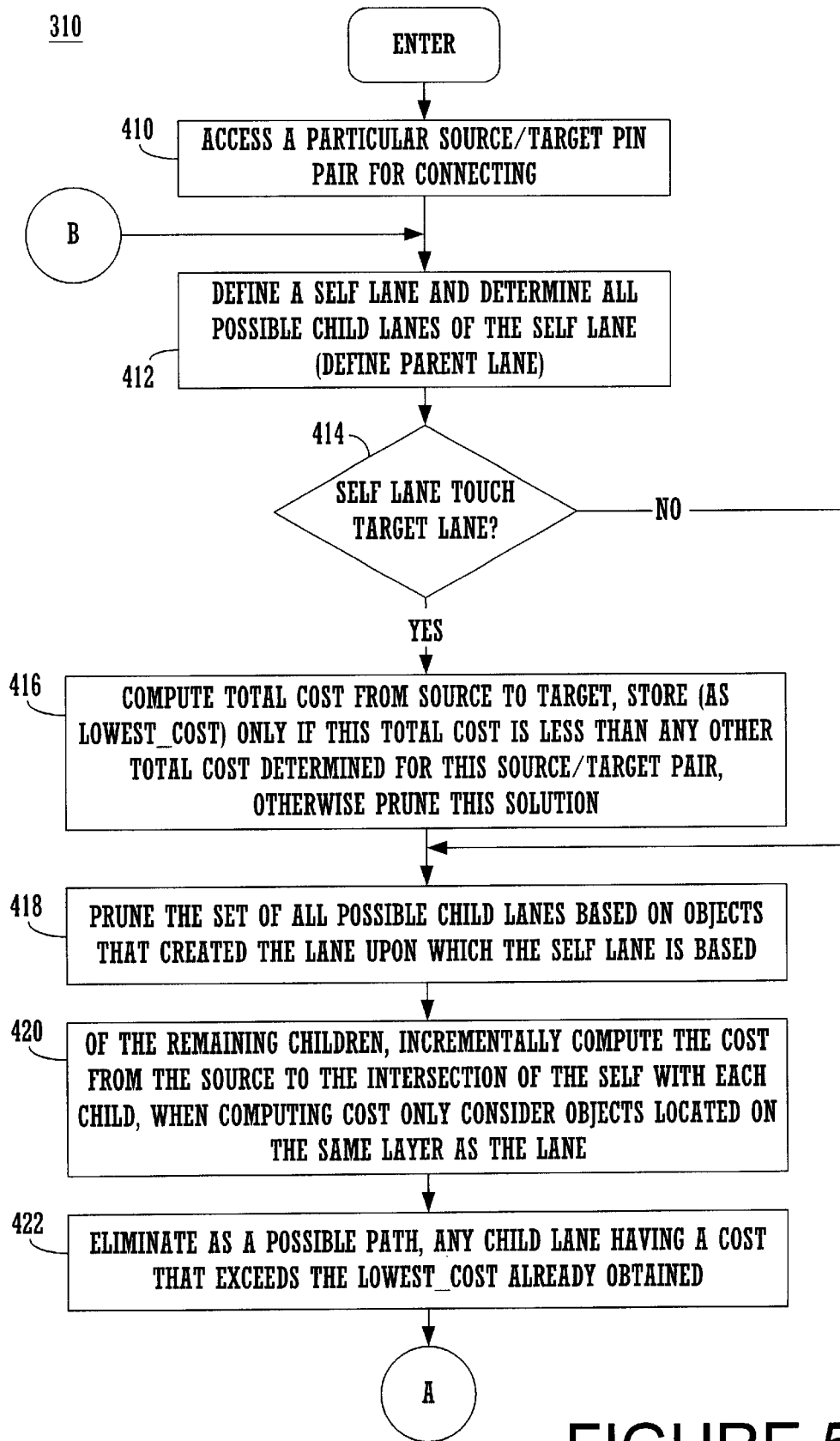
FIG. 5B and FIG. 5C represent a flow chart of steps of the wire routing process of the present invention for efficiently discovering a low cost wire route between a source pin and a target pin.
Figure 5C:
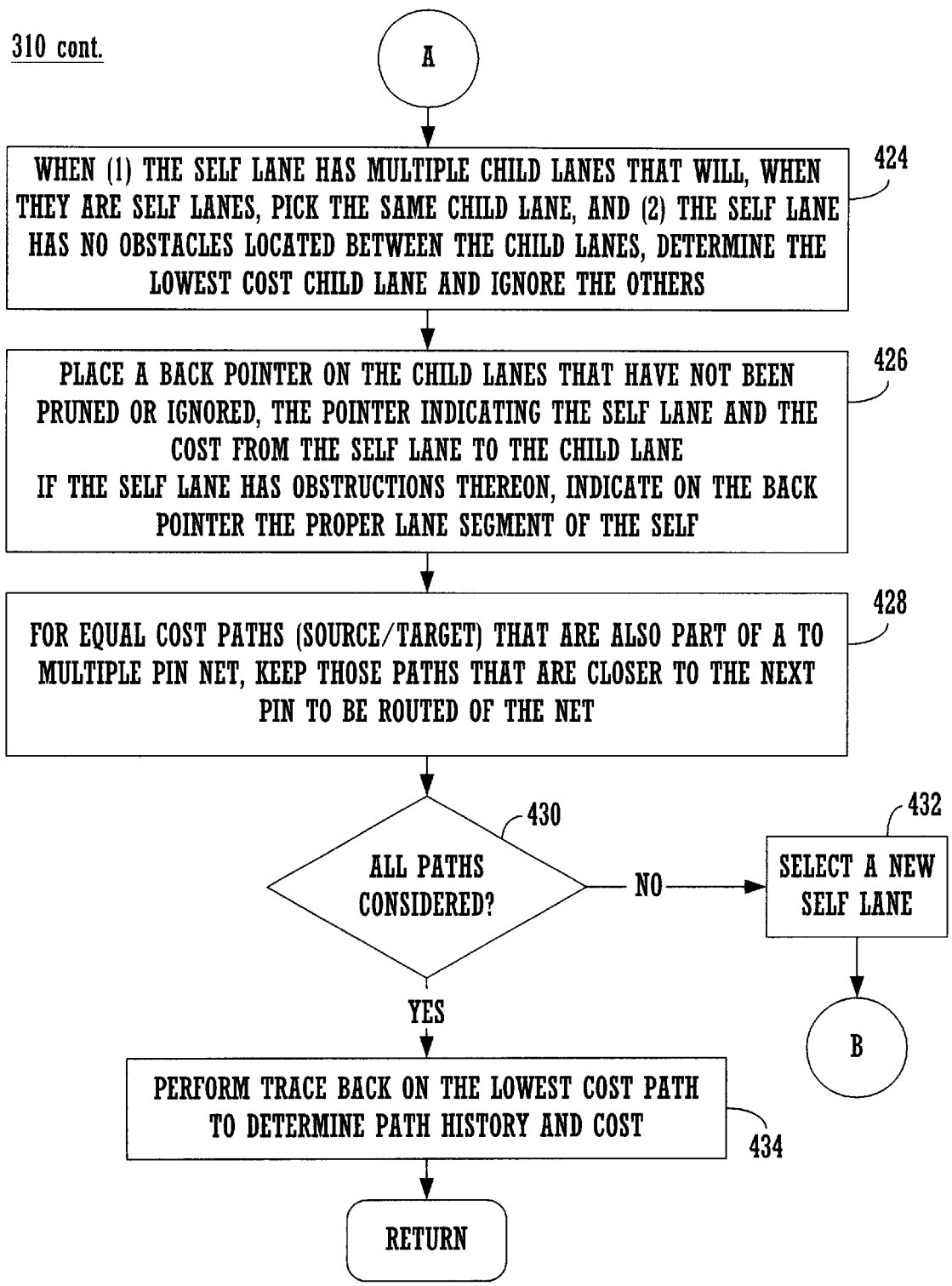

Step 310 is expanded in FIG. 5B and FIG. 5C. The output of step 310 is a routed wire connection between the source and the target.

At step 312 of FIG. 5A, the present invention checks if any more source and target pin pairs remain for processing through the given iteration. If so, then at step 314, a next source/target pin pair is selected and step 310 is entered again in a sequential process through the remaining source/target pin pairs. If the last source/target pin pair has been processed for the given iteration, then step 316 is entered and a routed wire solution is reported. At step 316, the present invention checks the number of routes that are not clean, as recorded by step 310. At step 316, the present invention checks if the total number of wire overlaps within the given wire solution decreased over the last iteration. If so, then at step 318, another routing iteration is performed through all of the source/target pin pairs where each source/target pin pair is sequentially processed as described above.

At step 316, if the iterative routing process 300 is not converging on a better wire solution, e.g., the number of overlaps is not decreasing (or is zero), then step 320 is entered where a report of the current routing solution is generated. Therefore, within process 300, source/target pin pairs are considered sequentially, as shown through steps 310, 312 and 314 from start to finish. The routing process 300 is iterative in that the above process is performed a number of different times as shown by steps 316 and 318, before a report of the final routing wire solution is made, at step 320.

FIG. 5B and FIG. 5C illustrate steps performed by the present invention in process 310 (of FIG. 5A). It is appreciated that process 310 is realized as instruction code stored in computer readable memory units of computer system 112 which are executed by processor 101. At step 410 of FIG. 5B, the present invention access a particular source/target pin pair for connecting with a wire connection. The particular order of source/target pin pairs can be selected based on any ordering scheme. However, the source/target pin pairs are sequentially processed as described with respect to FIG. 5A.

At step 412 of FIG. 5B, the present invention, based on a defined self lane, determines all possible child lanes of the self lane. During processing of step 412, the orthogonal child lanes to the self lane are discovered. In the definition of any path, one child lane is picked by the self lane of the number of child lanes discovered. At step 412, the present invention also assign's the parent lane, assuming the self lane is not defined based on the source pin, in which case there would be no parent lane to consider. The parent lane is the lane that picked the self lane when the self lane was a child of the parent (in a prior processing step).

Figure 6:
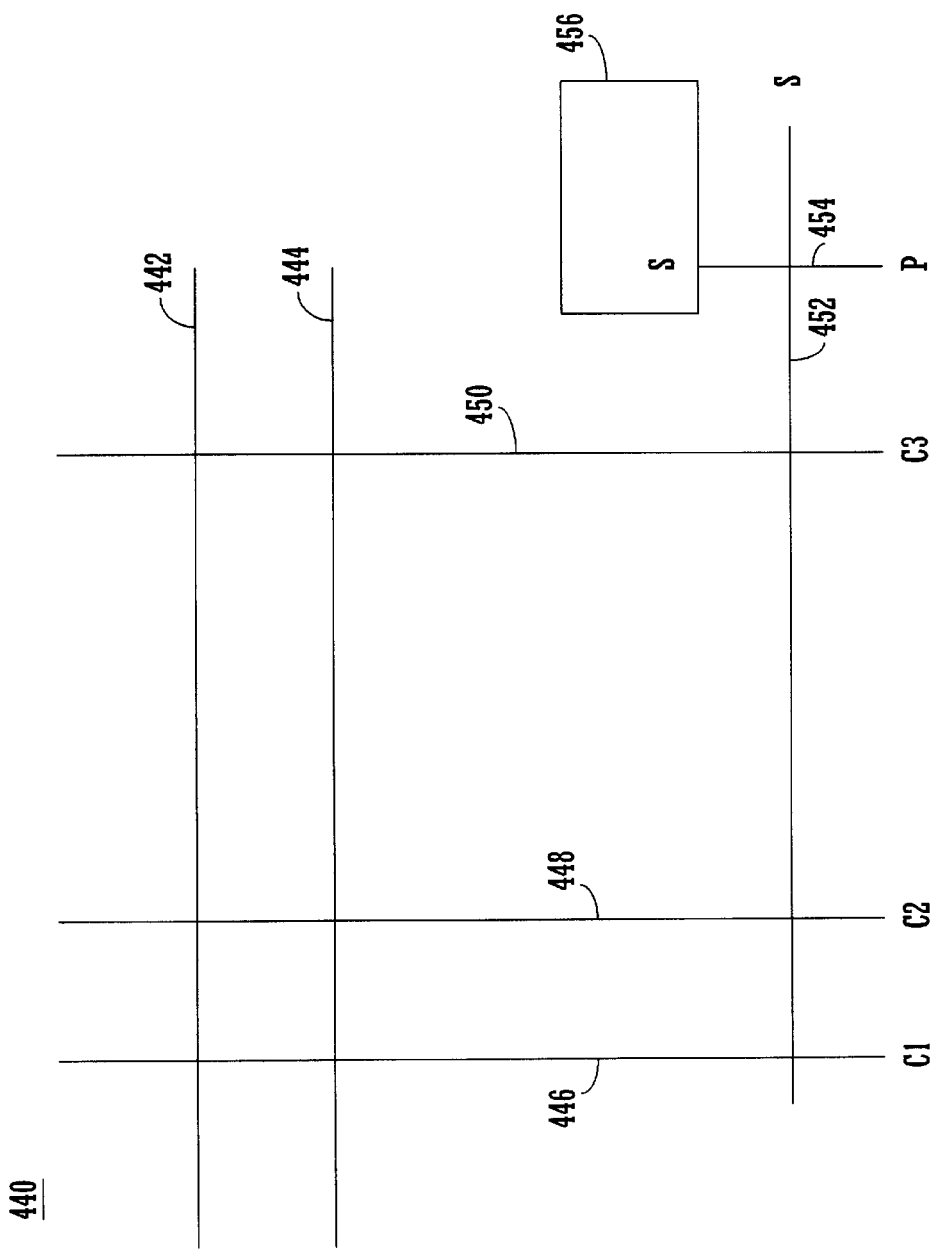
FIG. 6 is an illustration of a source pin, a parent lane, a self lane and child lanes of the self lane used in the gridless bused routing process of the present invention.

FIG. 6 illustrates an exemplary layout portion 440 having lanes (the objects defining the lanes are not shown for simplicity). In the case of FIG. 6, all horizontal lanes are within layer one and all vertical lines are within layer two. In portion 440, self lanes parent lanes and child lanes are defined. The self lane is defined as the lane on which path and cost processing is currently focused. Assuming lane 452 is the current self lane, then any orthogonal lanes, of the same layer or adjacent layers, are considered to be its child lanes (except for the parent lane which is eliminated as a possible child lane to avoid redundancy). Therefore, the child lanes of self lane 452 are lanes 446, 448 and 450. When determining a particular path from the source to the target, the self lane selects a particular child lane in furtherance of reaching the target lane (not shown). Therefore, the child lanes and the parent lane are orthogonal to the self lane.

The parent lane to the self lane is the lane that picked the self lane in a prior processing iteration. Therefore, the parent lane to self lane 452 of FIG. 6 is lane 454, which is also the source lane from the source pin of block 456. It is appreciated that assuming the self lane 452 picked child 448, for one path, then on the next processing iteration: 1) lane 448 would be the self lane; 2) lanes 442 and 444 would be the child lanes; and 3) the parent lane would be lane 452.

At step 414 of FIG. 5B, the present invention then determines if the self lane touches the target lane. If so, then path processing for the current path is almost complete because the target has almost been reached. If this is the case, then at step 416, the total cost of the path from source to target is computed by taking the computed cost to the current point (thus far along the path) and computing the remaining cost on the target lane to the target pin. This value is stored as the lowest_cost assuming this is the first path to reach the target. If this is not the first path, then the value computed at step 416 is compared against the stored value of the lowest_cost. If the cost of the current path is equal to or more than lowest_cost, then the current path is ignored because it is not the lowest cost of the paths already considered. However, if the cost of the current path is less than lowest_cost, then at step 416 the lowest_cost value is replaced with the newly computed cost.

A back pointer is then placed at the target lane indicating the lowest_cost and an indication of the next lane down the lowest cost path yet considered. At the completion of step 416, only one backpointer remains placed at the target lane. The backpointer is the parent pointer. The backpointer comprises a total cost computed and a pointer indicating the next (orthogonal) lane along the path to which the total cost is associated. In this fashion the present invention maintains information regarding the lowest cost computed path yet processed. Backpointers are described more fully below.

Object Based Pruning. At step 418 of FIG. 5B, the present invention performs object based pruning of the potential child lanes that were discovered in step 412. In order to reduce the total number of possible paths between the source and the target that need to be processed, the present invention at step 418 performs an object based pruning process. This pruning process is aimed at speeding up the routing process while not eliminating all of the potential good routes between the source and the target. Object based pruning is described below with reference to FIG. 9 and FIG. 5D.

Figure 9:
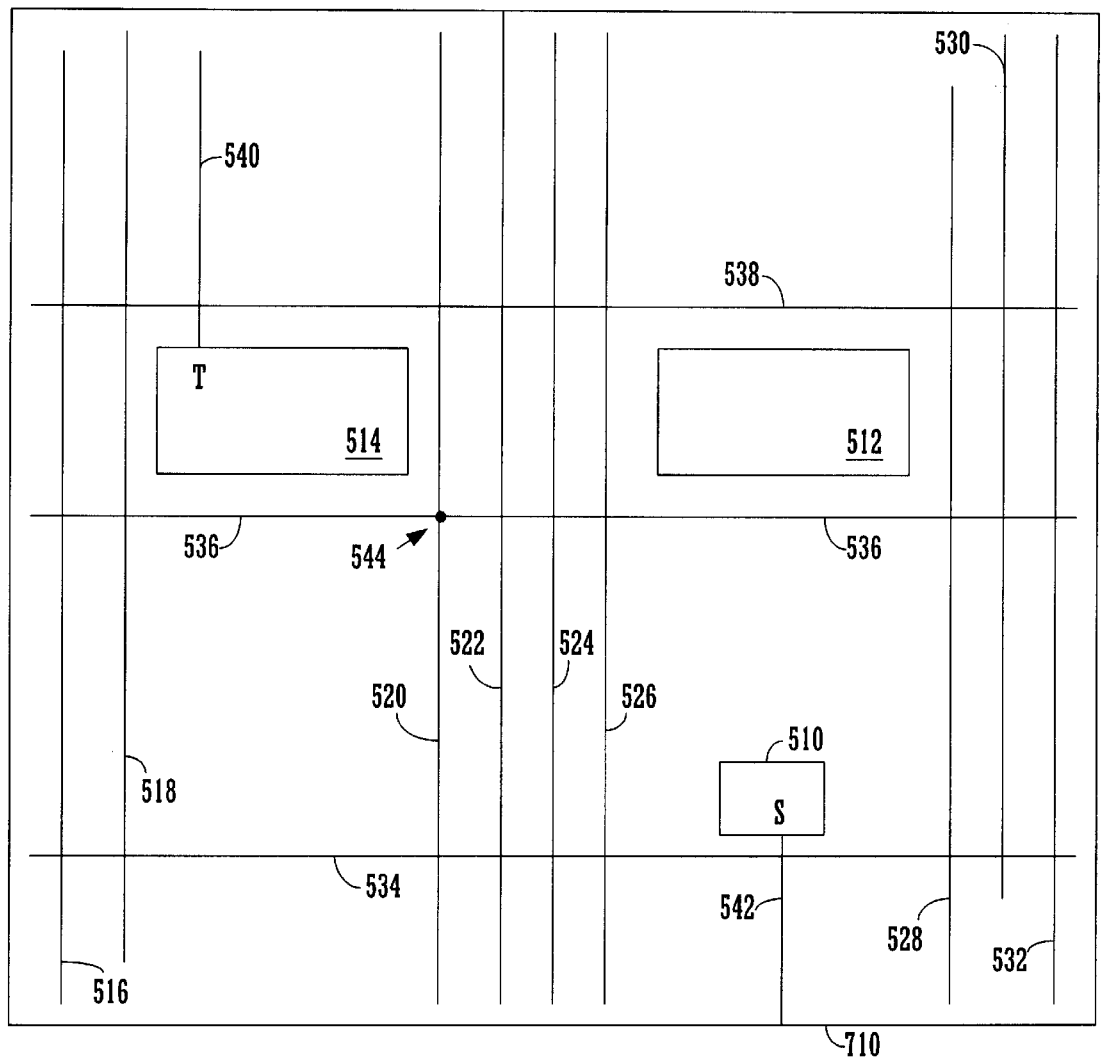
FIG. 9 is an exemplary layout illustrating the path pruning heuristic utilized by the router of the present invention for pruning potential paths between a source pin and target pin based on the location of obstructions that define the self lane.

Refer to FIG. 9 which illustrates an exemplary layout portion 710 including blocks 514, 512 and block 510. Also refer to FIG. 5D which illustrates the steps of the object based pruning process 418 of the present invention. Assume that block 514 does not exist for this example. Assume also that lane 536 is the self lane and that lane 520 is its parent lane. In this processing iteration, the possible child lanes are vertically aligned lanes 516, 518, 522, 524, 526, 528, 530 and 532 as would be reported from step 412. Lane 520 is not a child lane because it is the parent lane and therefore cannot be characterized as both a parent an a child lane. At step 810 of FIG. 5D, the object that defined the self lane is identified as object 512. At step 812, the intersection of the self lane and the parent lane is identified. The intersection of the parent lane 520 and the self lane 536 is shown as a small dot 544.

At step 814, object based pruning acts to invalidate child lanes depending on the side of an object to which they reside with respect to the intersection (e.g. 544) of the parent and self lanes. The object of interest is that object that defined the self lane. Therefore, since the self lane is lane 536, it was defined based on circuit block 512 (assuming block 514 is not present). The present invention therefore prunes all child lanes that lie on the same side of object 512 as lies the intersection 544 (while keeping lane 526 because this lane is defined by object 512, see step 816). Another way to describe object based pruning is that only those children remain valid that lie on the opposite side of the object 512 with respect to intersection 544 (while keeping lane 526). In the above example, only lanes 526, 528, 530 and 532 remain valid child lanes for self lane 536, all the other child lanes are invalid and do not represent possible paths from the self lane 536 to the target.

Refer to FIG. 9 and in this following case assume that block 514 exists and block 512 does not exist. Assume also that the self lane is lane 536 and the parent lane is lane 520 as before. Applying object based pruning to this case yields valid child lanes of only 516 and 518 for self lane 536. Lane 520 cannot be a child lane because it is the parent lane to self lane 536. The object defining self lane 536 in this case is object 514 (assuming object 512 does not exist).

Those child lanes located on the opposite side of object 514 to intersection 544 are lanes 516 and 518. In this case, lanes 522–532 are invalid child lanes and are pruned. In the above example, only lanes 516 and 518 remain valid child lanes for self lane 536, all the other child lanes are invalid and do not represent possible paths from the self lane 536 to the target.

Figure 5D:
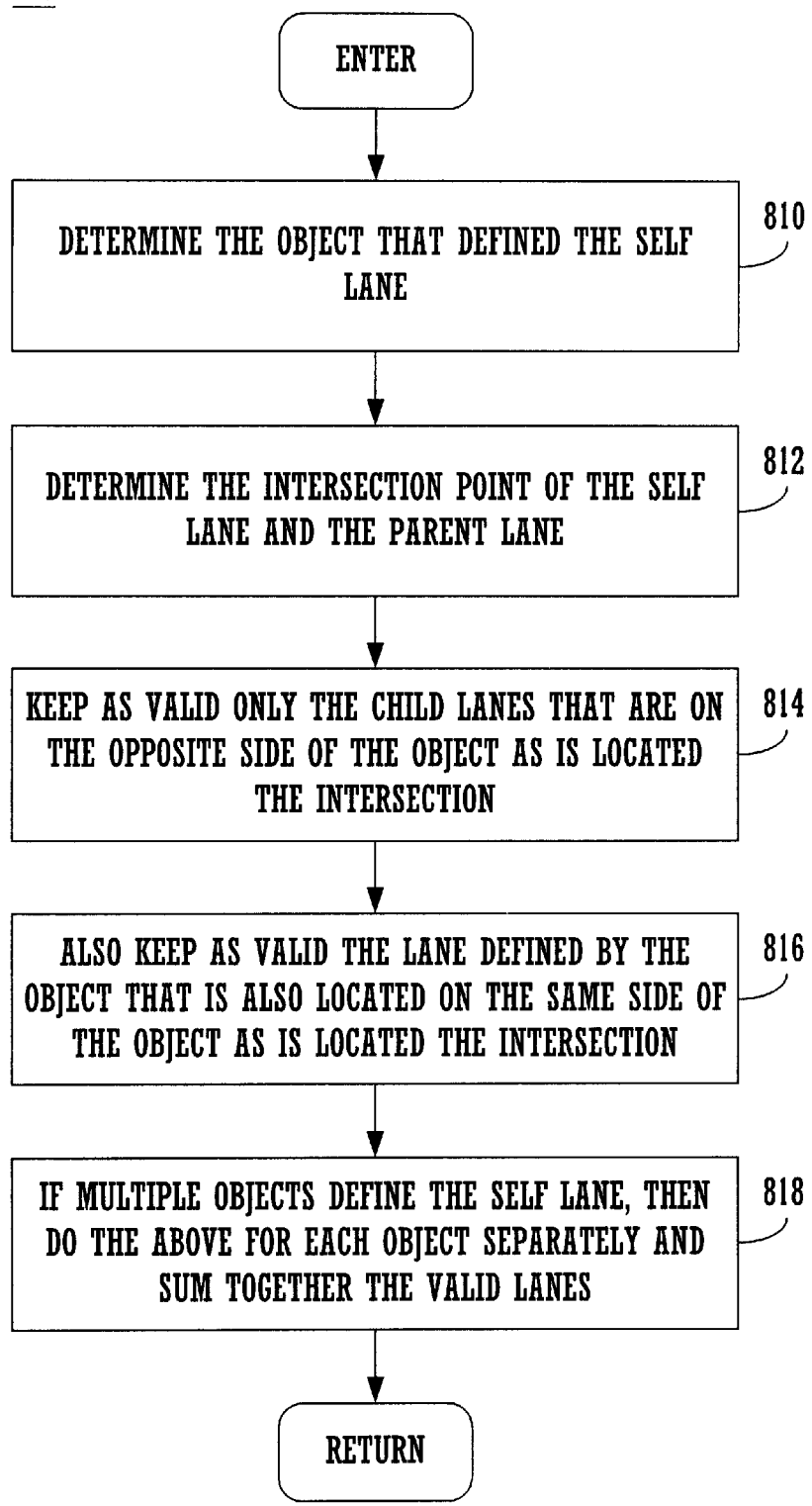
FIG. 5D is a flow diagram illustrating steps of the present invention for performing object based path pruning.

Refer to FIG. 9 and in this following case assume that block 514 exists and also that block 512 exists (refer to step 818 of FIG. 5D). Assume also that the self lane is lane 536 as before and the parent lane is lane 520. In this case, both objects 512 and 514 define the self lane 536. In a case like this, the valid children to the self lane 536 are the summation of the valid child lanes for each of the above cases, e.g., assuming only one block exists independently. Therefore, in the case where both blocks 514 and 512 exist, the valid child lanes to self lane 536 are lanes 516, 518, 526, 528, 530 and 532.

Child Cost Computation. At step 420 of FIG. 5B, of the remaining valid child lanes that have not been pruned by step 418, the present invention incrementally computes the cost of reaching the intersection of each child lane and the self lane from the last relevant self/child cost computation performed. If a cost is computed that is larger than the cost computed to reach that point from another pathway, then the higher cost is ignored. Therefore, in computing the incremental cost associated with valid child lane 530 (FIG. 9), the cost is computed from intersection 544 to the intersection of self lane 536 and child lane 530. This is performed for each valid child lane. For each child lane, a backpointer is placed indicating a link to the parent lane and the aggregate cost to reach that point from the source. At step 420, only the lowest cost to reach that point is ever saved in the backpointer. As described below, backpointer pruning is also performed by the present invention to save memory resources.

Figure 10A:
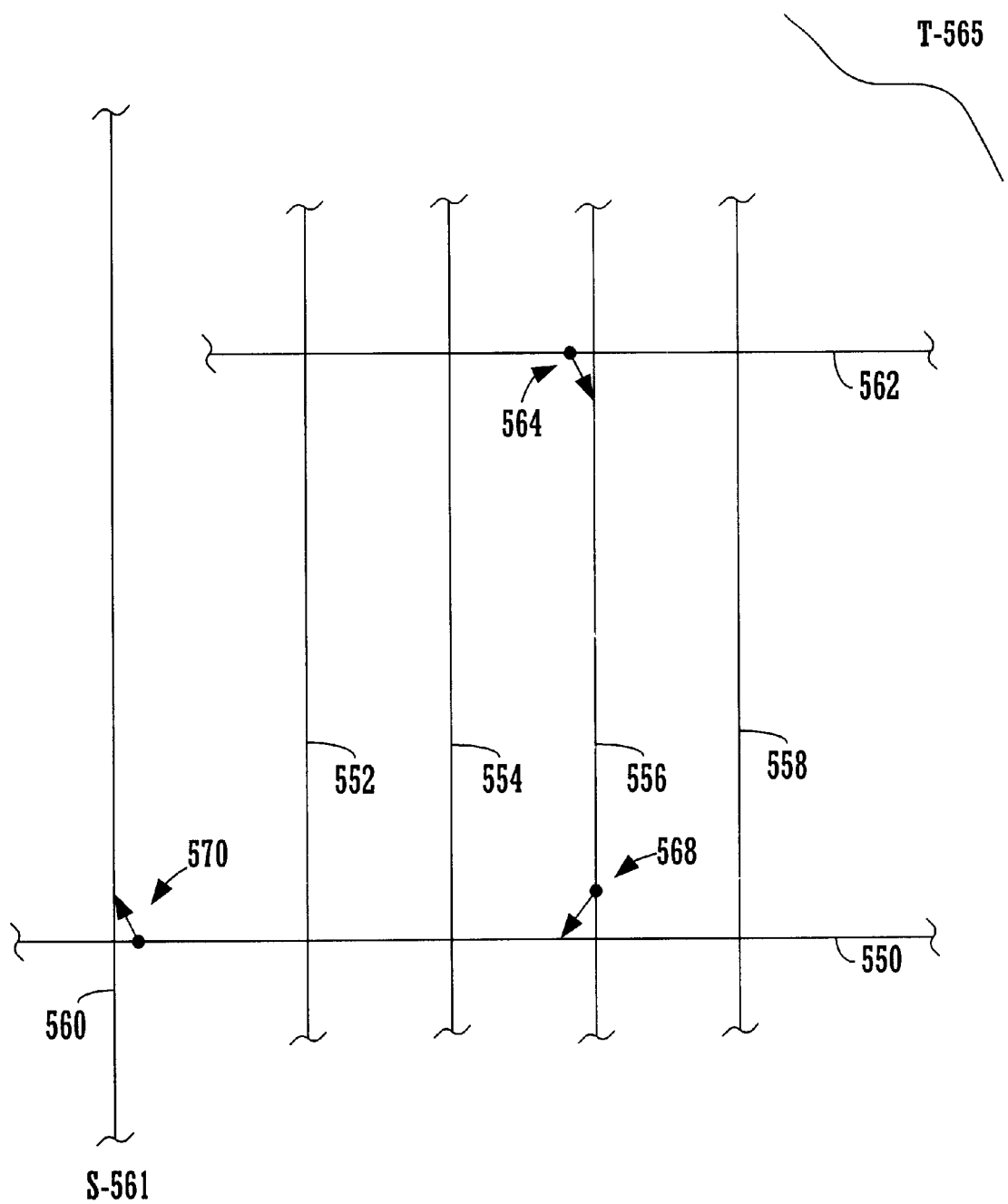
FIG. 10A is an exemplary layout illustrating the pruning heuristic employed by the router of the present invention for ignoring higher cost child lanes that all select the same lane and retain the low cost child lane.
Figure 10B:
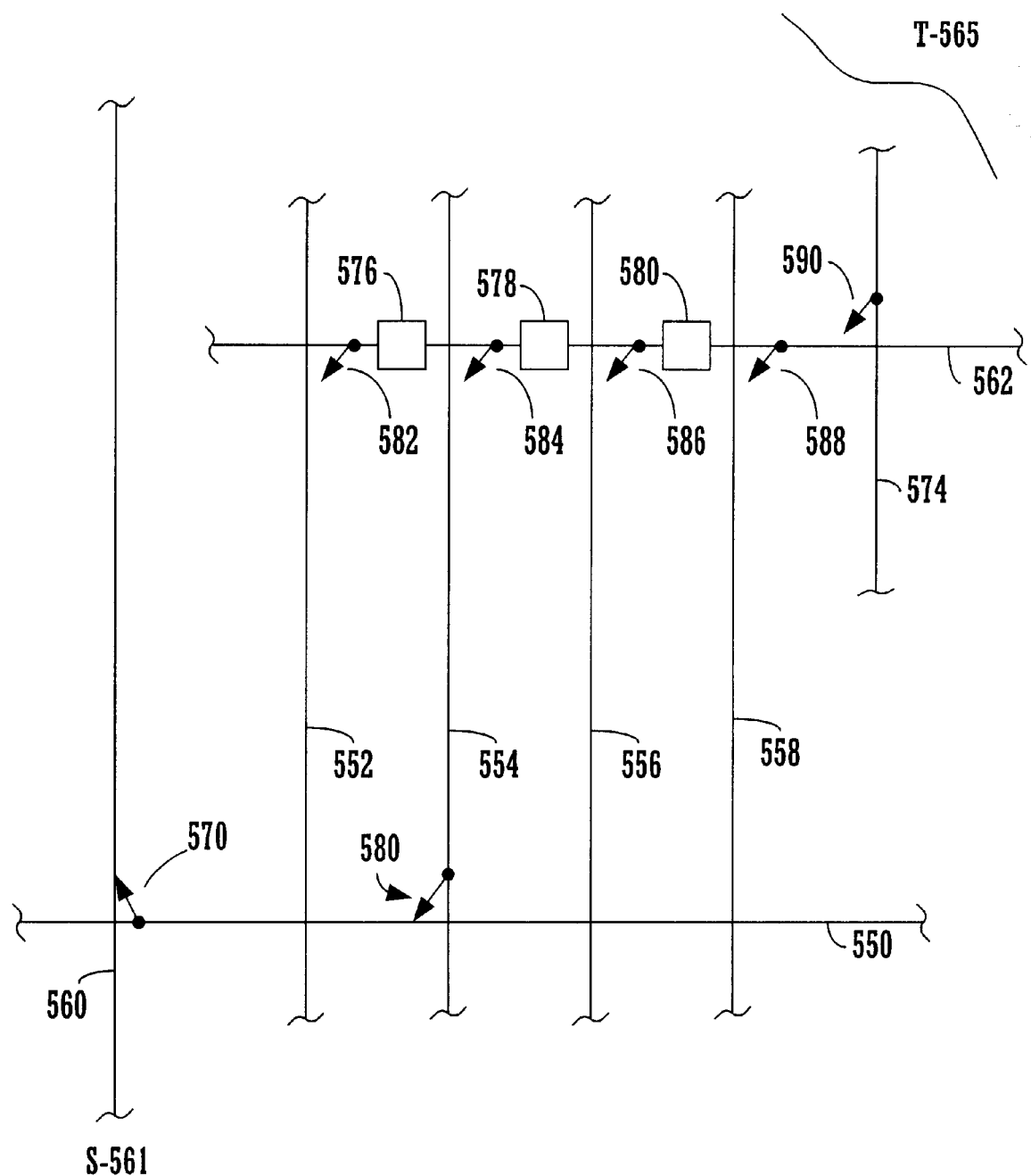
FIG. 10B is an exemplary layout illustrating a case where the pruning of the type shown in FIG. 10A is not allowed because obstacles or obstructions exist within the lane selected by all the child lanes.
Figure 10C:
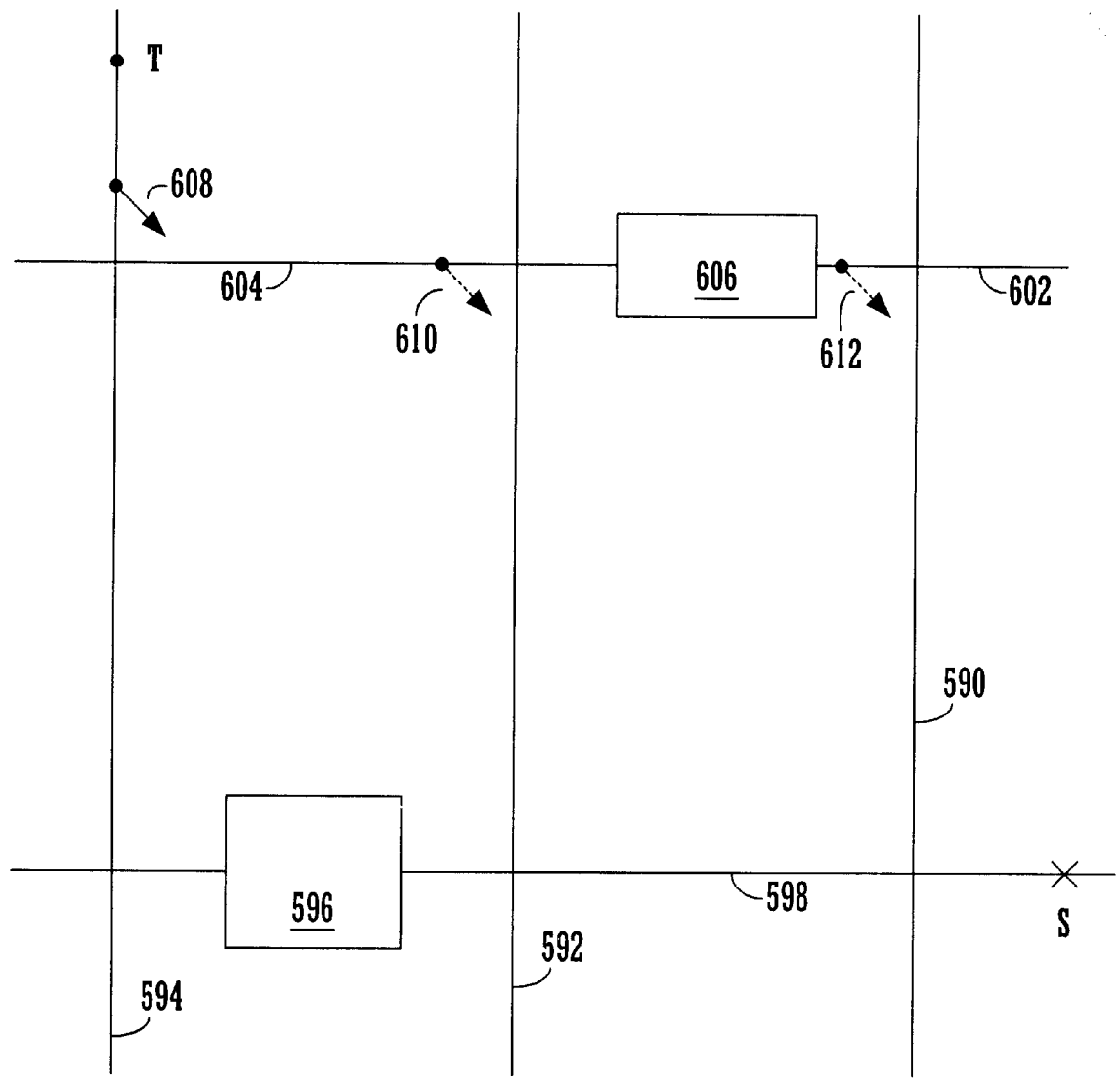
FIG. 10C illustrates that each lane segment, as defined by the placements of the obstacles within the lane, is treated like a separate parent instance within the present invention thereby receiving its own back-pointer.
Figure 10D:
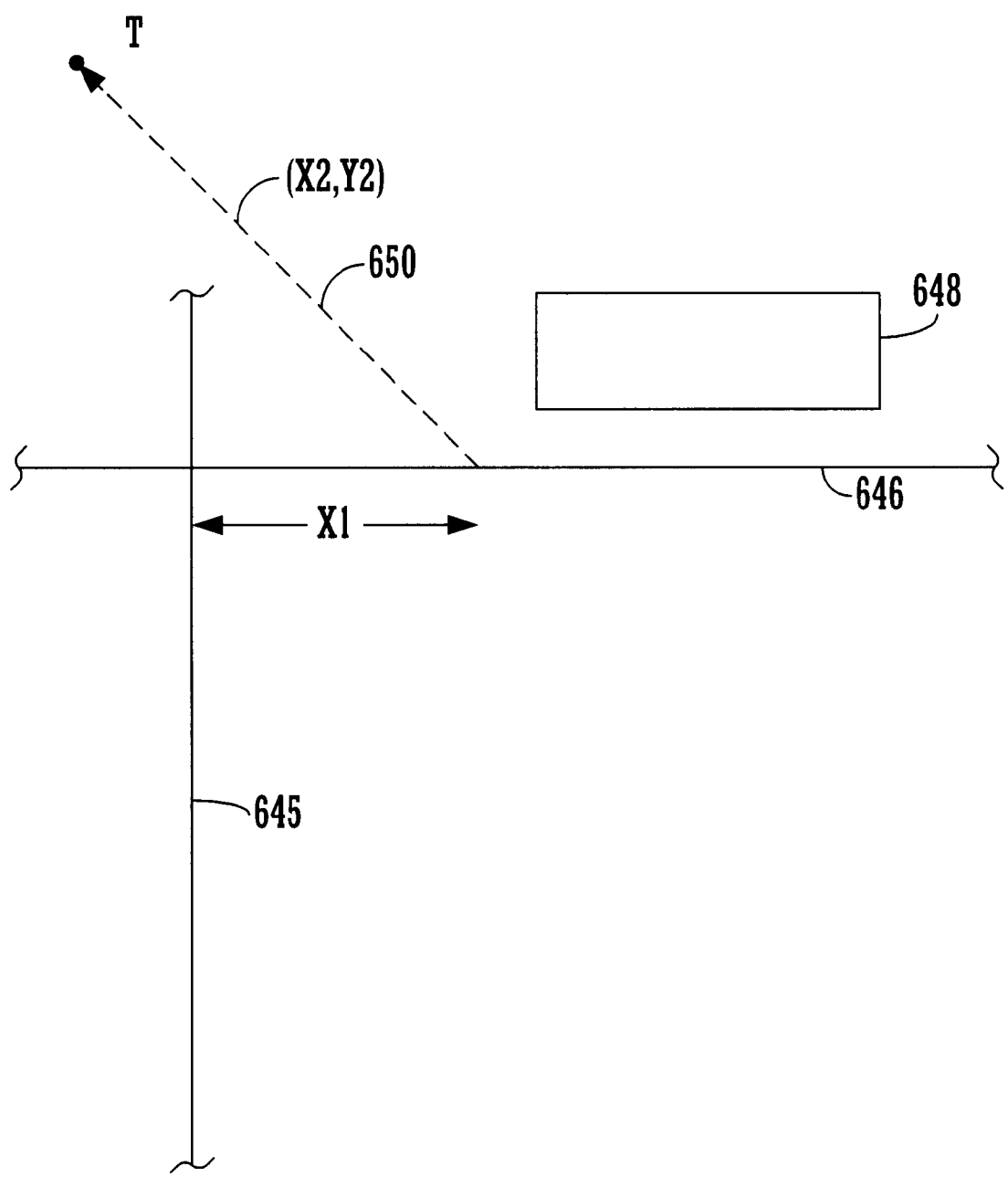
FIG. 10D is an illustration of the cost computation for the estimated cost from the child/self lane to the target in accordance with the present invention.

FIG. 10D illustrates the estimated cost computation performed by the present invention to compute the cost from the self/child lane to the target. This is the Cost4 term described above. The self lane is lane 645 and the child lane is lane 646. The child lane 646 is based on object 648. Span X1 is from the self lane 645 to the object 648. Distance 650 is therefore based on the edge of object 648 to the target. Distance 650 is the manhattan distance between the edge of object 648 and the target and is composed of X2 and Y2 orthogonal distances, as shown. Cost4 is based on the distance 650 for the child lane 646 and represents the estimated cost to the target.

Same Layer Cost Computation Simplification. At step 420 of FIG. 5B, the present invention reduces the complexity of computing the cost of a path by only considering the cost of soft objects that lie within the layer of the lane being considered. In the past, in order to locate the minimum cost of all possible paths, the prior art router would search through and thereby consider all layers above and below a lane when attempting to locate the lowest cost path in that direction. This was done because a lower cost might be discovered by diving or rising to different layers along the same direction of a particular lane to avoid soft obstructions and also because different layers might have different costs. However, this process is too time consuming and is process intensive as the search space explodes in three dimensions thereby creating process periods that are not practical.

The present invention appreciates that the final objective of its routing wire solution is not to determine the absolute lowest cost routing solution, but to determine a good, clean routing solution. The present invention therefore uses the cost computation as a vehicle to determine a good routing solution, but not necessarily to determine the cheapest solution.

Therefore, at step 420, the present invention does not consider the objects of multiple layers when determining the cost of a lane, but rather examines the objects of only the same layer as the lane being considered. As a general rule, during cost computation for overlapping soft objects (e.g., those that can be routed over) the present invention considers only those objects within the same layer on which the lane of the path exists. Objects outside of the pertinent layer are not considered. Objects of other layers are only considered within the cost computation when the path switches to a lane that resides on their layer. This cost computation refinement can lead to being off a small amount from obtaining the lowest cost solution, but yields satisfactory results with a much more shortened computation time.

Figure 7:
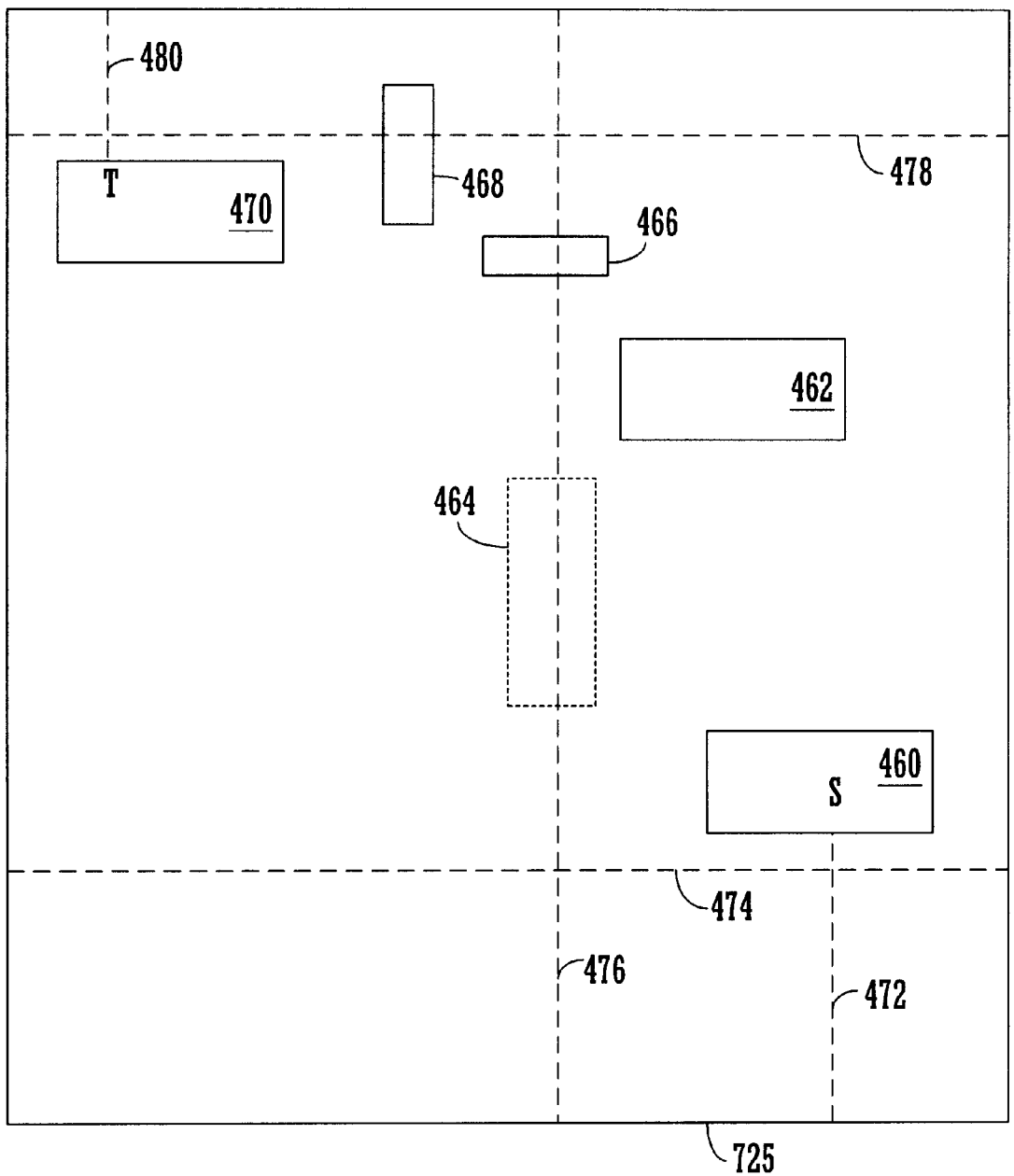
FIG. 7 is an exemplary layout illustrating the cost simplification utilized by the router of the present invention that considers only obstacles within the same layer as the lane considered during cost computations.

For instance, refer to FIG. 7 which illustrates an exemplary integrated circuit layout portion 725. Objects 470, 462 468 and 460 are within layer one. Object 464 is within layer two and object 466 is within layer three. The source is within object 460 and the target is within object 470. A potential path exists along lane 472 and line 474, switching to lane 476, switching to lane 478 and switching to lane 480. Lane 476 is vertical and runs within the first layer. Lane 476 is defined based on an object that is not shown. During the computation of the cost of the path that is described above, the present invention does not compute any overlap cost associated with overlapping objects 464 and 466 because these objects do not reside within layer one, which is the layer of lane 476. Also, during cost computations for lane 476, step 420 does not consider the costs of traversing through any other layer but layer one, the layer that contains layer 476. Focusing on lane 478 (of layer two), the present invention again does not consider the overlap cost of object 468 because this object is located within the layer one, a different layer. Step 420 does not compute any costs of layer traversal except for layer two for lane 478. Therefore, the overlap cost computation performed by the present invention at step 420 is restricted to objects that lie within the same layer as the lane under consideration for the prospective path.

Figure 8:
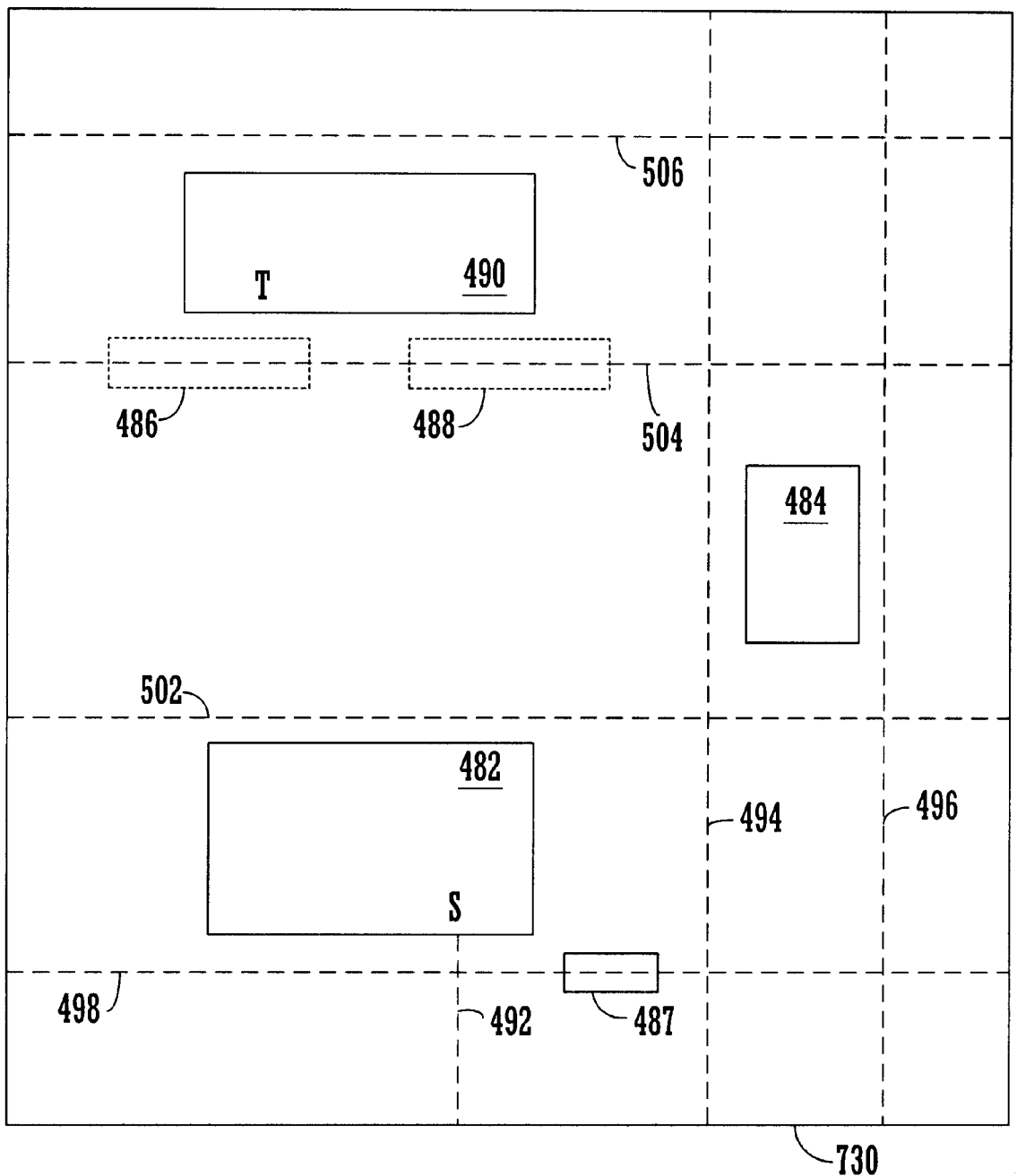
FIG. 8 is a second exemplary layout illustrating the cost simplification utilized by the router of the present invention that considers only obstacles within the same layer as the lane considered for cost computations.

FIG. 8 illustrates another example of the layer restriction of the cost computation performed by the present invention at step 420. The layout portion 730 of FIG. 8 includes objects 486 and 488 of layer two with objects 490, 484, 482 and 487 of the first layer. In this example, horizontal lanes 506, 504, 502 and 498 are of the first layer and the vertical lanes 494 and 496 being of the second layer. A potential partial path from the source to the target exists on lane 492 to lane 498 to lane 494 to lane 504. Since objects 486 and 488 lie on the second layer and lane 504 is on the first layer, then objects 486 and 488 are not considered during the cost computation for this path because the layers are different. With respect to lane 504, only objects and layer information associated with the first layer are considered during cost computations. However, object 487 (a soft obstruction, e.g., allowing routing thereover) and lane 498 both lie on the same layer, e.g., layer one. Therefore, the cost of overlapping object 487 is considered when computing the total cost for the above described source/target path.

At step 422 of FIG. 5B, several child lane cost computations have been performed, e.g., one for each valid child lane to the self lane. At step 422, potential paths are eliminated by comparing their aggregate costs (from the source) to the stored lowest_cost value (assuming any exists) which was stored by step 416, assuming at least one path has been discovered already. The optimization here realizes that partial paths having a higher cost than a previously discovered path need not be completed and thereby consume processing cycles because these paths will not lead to a lower cost solution to the path already discovered. Any child lane is pruned (e.g., eliminated as a potential path) that has an associated cost, that when aggregated from the source, is larger than lowest_cost.

Also, any child lane is pruned that has a larger cost of traversing to its point than any other pathway that had to also traverse to that same point.

Figure 5E:
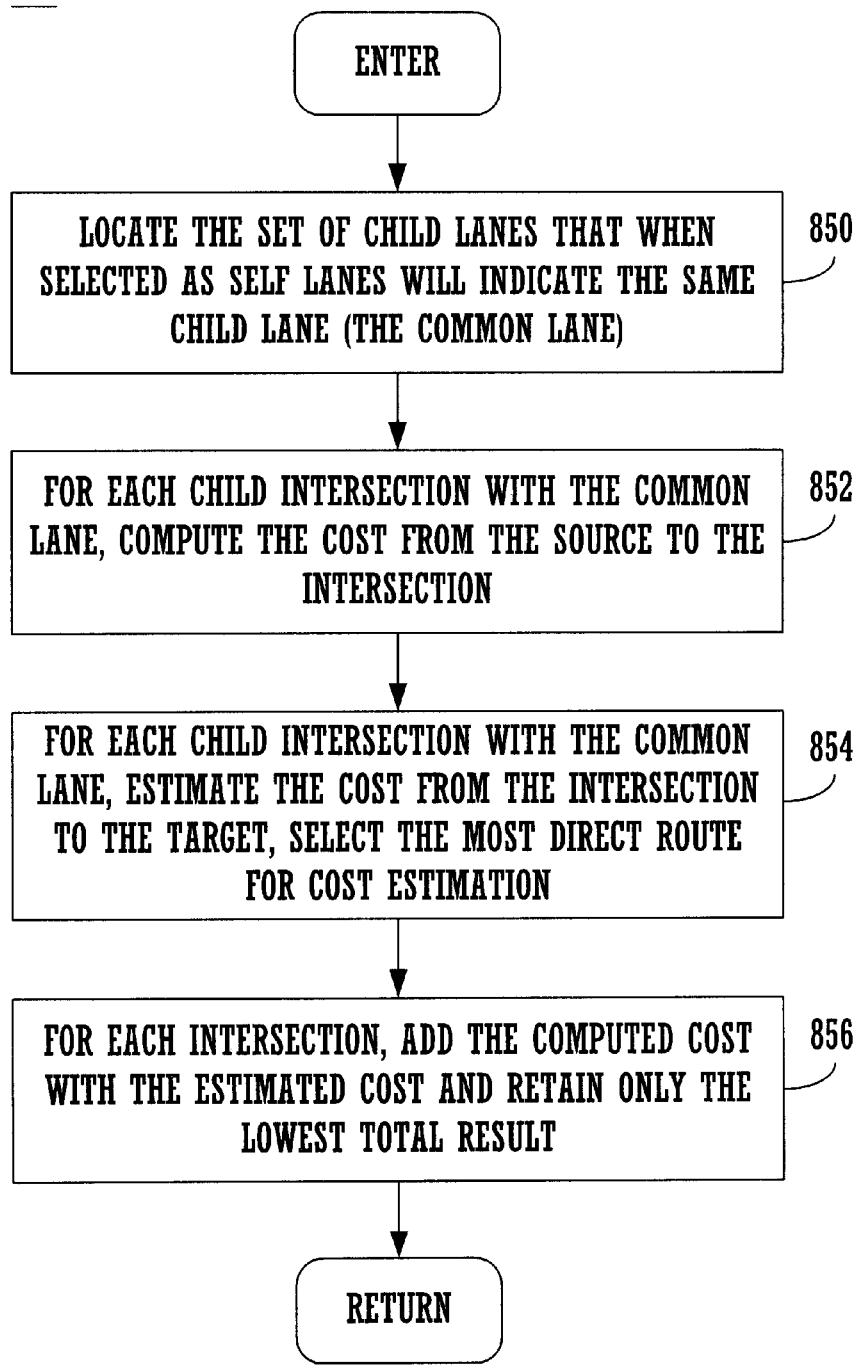
FIG. 5E is a flow diagram illustrating steps of the present invention for performing backpointer pruning when a lane (not having obstructions thereon) has multiple parent lanes.

Backpointer Pruning. At step 424 of FIG. 5C, the present invention performs another pruning event for situations in which multiple child lanes will pick the same lane in future self lane processes. In other words, the present invention looks ahead to discover cases in which multiple lanes, as self lanes, will pick the same child lane. In this case, a particular lane can have multiple parent lanes picking it. FIG. 10A illustrates an example of this case and FIG. 5E illustrates a flow diagram of steps performed by process 424. Source 561 and target 565 are shown. Assume lane 550 is the self lane, then its child lanes are lanes 552–558 (each orthogonal to lane 550). When each lane of lanes 552–558 are processed as a self lane (in subsequent processings), they will all select lane 562 as a potential child lane. Therefore, lane 562 as a self lane will have multiple parent lanes, namely lanes 552–558. Refer to step 850 of FIG. 5E. In a case like this, when lane 562 is a child lane, there will be a cost computation from each "self" lane of lanes 552–558 to the child lane 562. However, in accordance with the present invention only the lowest cost computation need be stored as the backpointer 564 and the other cost computations can be discarded as they will not yield a lower cost solution.

Therefore, the present invention at process 424 of FIG. 5C performs the following cost computations for each intersection of lanes 552–558 and lane 562. First, at step 852 of FIG. 5E, for each intersection, a cost computation is performed between the source 561 and the intersection (incremental cost computations are performed to speed up this cost computation). Second, at step 854 of FIG. 5E, a cost estimation is performed for each intersection, based on the best possible route (assuming a clean route exists) from the intersection to the target 565. Incremental cost computations also increase the speed of these cost estimate computations. The total cost for any intersection is then (1) the computed cost plus (2) the estimated cost, which is shown in step 856.

At step 856, only that total cost having the lowest value is then used as the backpointer 564 from lane 562 and any path having a total cost larger than lowest_cost is summarily ignored. For instance, assuming that the computation with respect to lane 556 yields the lowest cost, as determined above, then only the back pointer 564 from lane 562 to lane 556 need be stored in memory, the other backpointers are eliminated as belonging to higher cost solutions. In effect, the parents having higher cost solutions are discarded as possible paths, at step 424, as an optimization step. If the lowest cost solution is still larger than lowest_cost, then all of these paths are ignored.

It is appreciated that when the above cost and cost estimate computations are being performed, whenever possible incremental cost computations are performed that can reuse the results of previous and relevant computations. In this fashion, the cost computations can be done faster. To this end, cost computations from intersection to intersection are typically performed and then added to the total intersection cost of a prior intersection to thereby yield the cost the next intersection.

Backpointers as Distributed Information. At step 426 of FIG. 5C, the present invention places backpointers on the child lanes that have not been pruned or eliminated as described above at step 424. FIG. 10A illustrates other backpointers 568, from lane 556 to lane 550 and another backpointer 570 from lane 550 to lane 560 (which is coupled to the source pin 561). It is appreciated that the present invention utilizes backpointers distributed across the lanes to represent path and path cost information from the target to the source. The backpointer is a data structure and includes an identification of the back pointed lane and a cost value. In effect, at any point, what is not known is the whole path, only a pointer from where the path came. In this manner, from the target, a unique path and cost information can be determined by tracing back (step 434 of FIG. 5C) from the target to the source along the directions given by the backpointers. In this fashion, the present invention stores "distributed" cost and unique path information as a memory optimization scheme.

Using backpointer data structures to represent unique path and path cost information, paths are not unique in the forward direction (e.g., from source to target) but are unique in the backward direction. Therefore, during traceback processing (step 434), the present invention starts at the target and traces back using the backpointers to the source to discover a unique path and path cost information.

Multiple Parent Backpointer. FIG. 10B illustrates a situation where the backpointer pruning of step 424 is not employed due to the soft objects 576, 578 and 580 of lane 562. In a case as shown in FIG. 10B, each segment of lane 562 acts as its own parent instance and therefore has its own backpointer to a lane. Step 426 of FIG. 5C processes this type of case. Multiple parent instances are allowed in these cases because, unlike the case of FIG. 10A, it is not known, a priori, whether the cheaper path will be to the right or to the left along lane 562 from the intersections of lanes 552–558 as a result of the placements of the objects 576, 578 and 580. Therefore, backpointer pruning is not done in these cases and multiple parent backpointers are allowed.

The result is shown in FIG. 10B where backpointer 590 points from lane 574 to lane 562 and lane 562 has a separate backpointer for each of its own segments (thereby effectively having several parent instances of itself). Backpointer 588 points from one segment back to lane 558; backpointer 586 points from the next segment back to lane 556; backpointer 584 points from the next segment back to lane 554; and backpointer 582 points from the next segment back to lane 552. In this case, the backpointer 590 needs to specify to which lane segment it points during traceback and this information is therefore stored in backpointer 590 as a lane segment indicator. During traceback, the lane segment indicator indicates the surviving path. In other words, backpointer 590 needs to specify which region of lane 562 it indicates. This is required so that the proper region of lane 562 is selected as the proper ancestor during traceback. For instance, in one case, backpointer 590 points to backpointer 584 which itself points to lane 554.

FIG. 10C illustrates a simplified example of the above with a source and a target and two objects 596 and 606. Soft object 606 lies within lane 602 which is picked as a child lane from both lanes 592 and 590. Object 606 prevents backpointer pruning, therefore lane 602 is divided into two separate segments, each having its own parent instance according to the present invention. This leads to backpointer 610 and backpointer 612 being established and stored in memory. A segment indicator in backpointer 608 is used by the present invention to select between the parent instances of lane 602 during traceback so that the surviving path can correctly be found during traceback.

Figure 11:
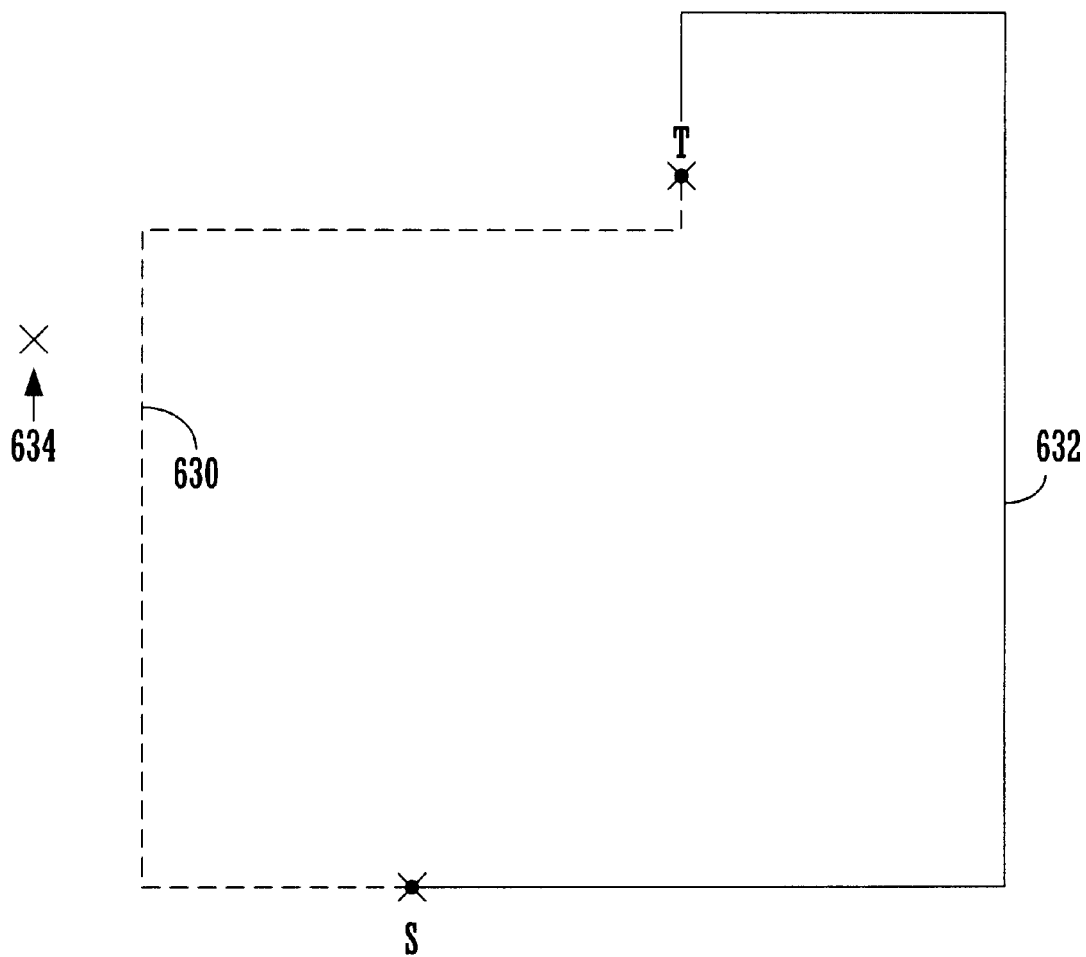
FIG. 11 illustrates an optimization used by the router of the present invention for selecting the closest path (between equal cost paths) to our unconnected path for multi-pin nets.

Multi-pin Net Processing. Step 428 of FIG. 5C handles path selection for multi-pin nets. At step 428, if multiple equal cost paths are available from the source to the target, then step 428 selects that source/target path that also comes closer to any other unconnected pin of the same net as the source/target pair. An example is shown in FIG. 11 having a source "S" and a target "T." Two possible equal cost paths between the source and the target are found and these include the solid line depicted path 632 and the dashed line depicted path 630. However, pin 634 is also to be connected to the same net as the source and the target in this case. The domain of path 630 comes closer to unconnected pin 634 than path 632. Therefore, at step 428, path 630 is favored over path 632 to provide a connection between the target and the source.

Figure 12:
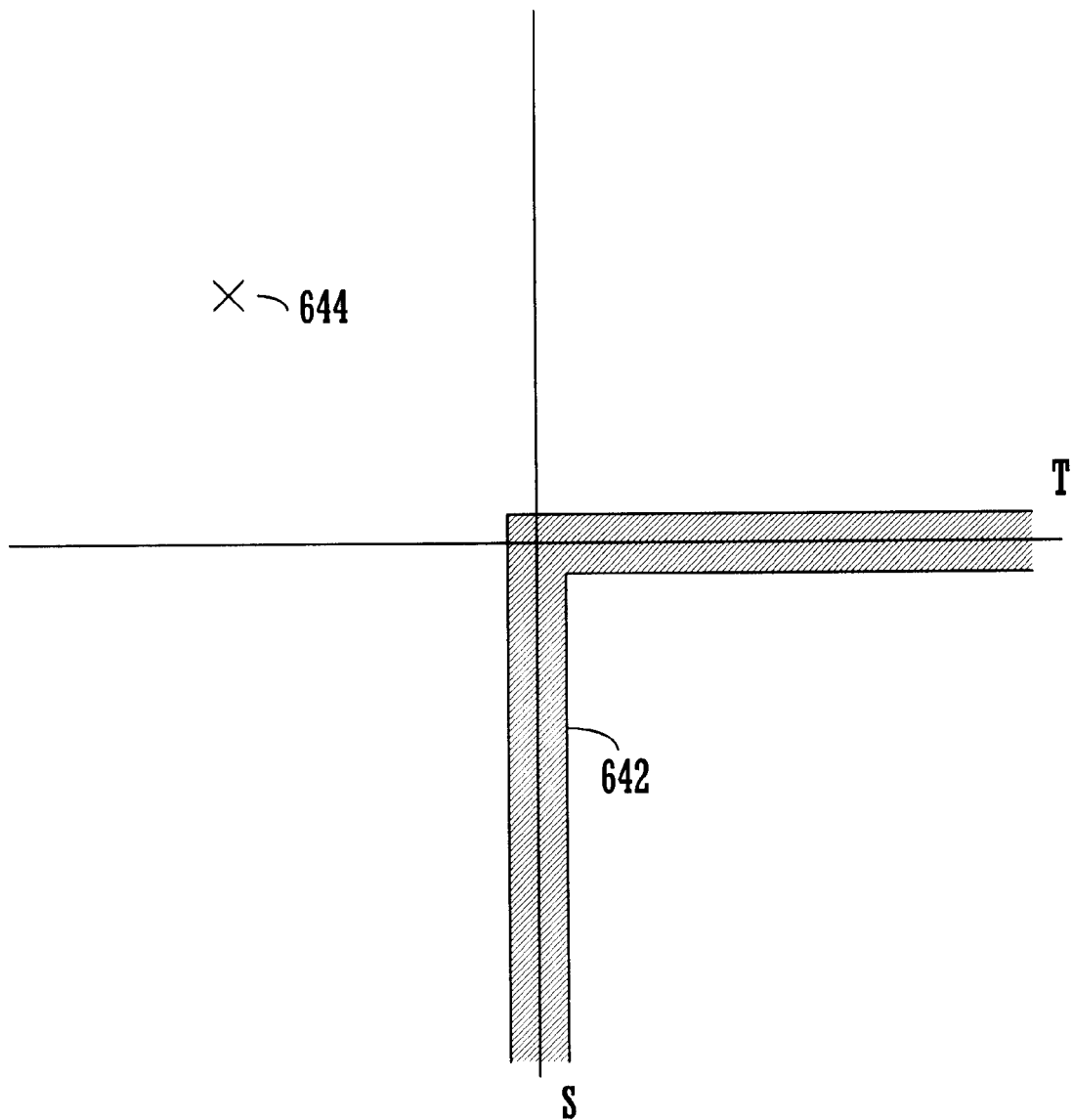
FIG. 12 illustrates an optimization used by the router of the present invention in treating the unconnected pin as the target and the source-target wire placement as a domain of sources for multi-pin nets.

FIG. 12 illustrates another optimization performed by the present invention in dealing with multi-pin nets. Assume that a source, "S," and a target, "T," are connected by a wire connection 642. When considering paths to connect unconnected pin 644 to this same net, the present invention treats the point 644 as the target and treats the domain of path 642 as sources for process 310. In this way, only one target (e.g., point 644) is being searched thereby increasing processing speed. Therefore, instead of finding all the possible paths to the target among the net 642, the present invention treats the disconnected pin 644 the target and the connected net 642 as the source. This configuration allows for a quick estimation of the cost because many source lanes are available but only one target lane is provided.

At step 430, the present checks if all paths between the source and the target have been considered. If not, then at step 432 a new self lane is selected by following a hierarchical ordering (e.g., depth or breadth first traversals can be used). Step 412 of FIG. 5B is then entered to process the new self lane. At step 430 of FIG. 5C if all paths have been considered then step 434 is entered for traceback. As described above, the backpointer information that is distributed within the lanes of the layout provides a unique path in the reverse direction (e.g., from the target to the source). Therefore, the present invention at step 434 commences at the target pin and traceback through the backpointers to the source to discover the lowest cost connection between the source and the target pin that was considered by process 310.

Assuming process 310 has been properly carried out, the target pin should have only one backpointer thereby allowing a unique, low cost solution to be found during traceback from lane to lane following the ancestor information of the backpointers. This source/target path and its cost are then reported as an output from process 310 as described with respect to FIG. 5A.

Figure 13:
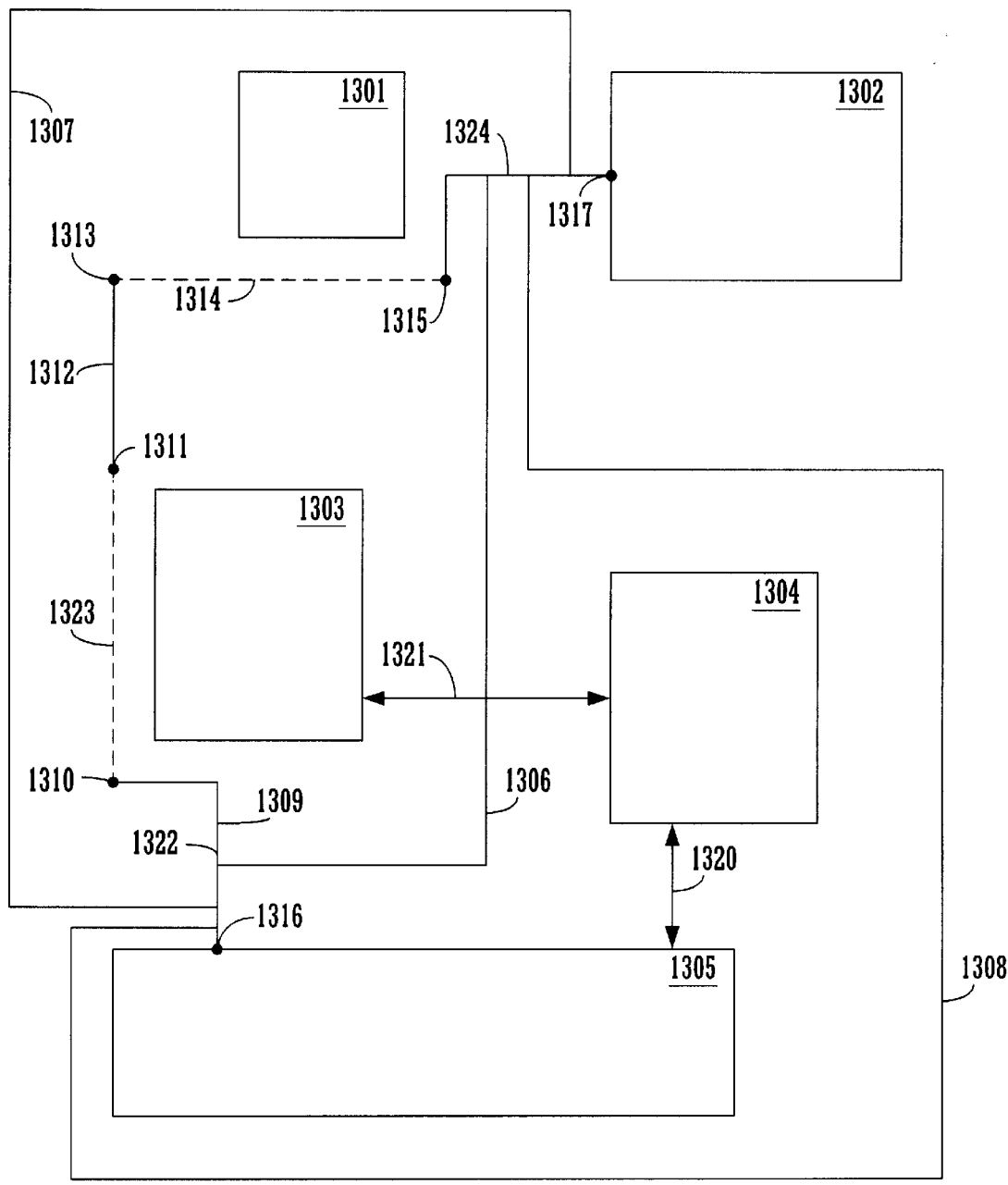
FIG. 13 shows a top level diagram for one layer of a coarse routing process.

FIG. 13 shows a top level diagram for one layer of a coarse routing process. In this example, five obstructions 1301–1305 are identified. These obstructions represent the areas that have been pre-defined or otherwise set aside for specific circuits and/or functions (e.g., macro blocks). For example, obstruction 1301 might be the area reserved for digital signal processing; obstruction 1302 can be an I/O interface; obstruction 1303 can be a piece of memory; etc. Each of these obstructions 1301–1305 have pins which need to be interconnected. For example, pin 1316 of obstruction 1305 should be connected to pin 1317 of obstruction 1302. There are many different paths by which pin 1316 can be routed to pin 1317. One direct path is shown as 1306. Alternative paths are shown as 1307 and 1308. There are many different ways by which a path may be physically routed to connect pins 1316 and 1317. Obstructions may be totally blocked on all layers for routing or may be blocked on certain layers (fully or partially). In FIG. 13, it is assumed that all layers are fully blocked.

The areas between adjacent blockages (or obstructions) are referred to herein as "passages." These passages represent the areas through which wire segments are allowed to be routed. A passage is created between two adjacent obstructions on the same layer. During coarse routing, each layer is assigned a routing direction (i.e., horizontal or vertical, but not both). The passages are created between obstruction edges in the routing direction. For instance, passage 1320 represents the area between the bottom edge of obstruction 1304 and the top edge of obstruction 1305. Passage 1320 is horizontal and belongs to a horizontal metal layer (e.g., metal layer 1). Conversely, passage 1321 represents the area between the right edge of obstruction 1303 and the left edge of obstruction 1304. Passage 1321 is a vertical passage and exists on a vertical metal layer (e.g., metal layer 2). Note that some passages are wider and some are narrower. The wider passages have more area through which a greater number of wire segments may pass through. Consequently, they are said to have greater routing capacity. Narrower passages have less capacity through which wire segments may be routed. As wiring segments are iteratively routed to interconnect the various pins of the obstructions, there will be instances whereby some passages are assigned greater number of wire segments as a result of the routing. For each obstruction edge in the direction of routing and on the layer of the obstruction, a lane is created. The exploration and route generation is identical to that of detailed routing for the lanes which have been identified during coarse routing.

Given the number of wire segments and the area of the respective passages, a routing density through each of the passages develops. At some point during the coarse routing process, there may be places in one or more passages which become overly congested. For example, an I/O obstruction inherently requires much greater routing resources. In an effort to ease the congestion, the present invention computes the cost of routing a particular wire segment, as described above. The coarse routing process of the present invention then chooses the routing of the wire segment which has the minimum attendent cost. It is not uncommon that a wire segment having a shorter distance will have a higher cost than a longer wire segment. This is because the shorter path is routed through higher congestion areas. In order to reduce congestion, a longer wire segment may ultimately be selected because of its lower cost.

Eventually, some passages may become so dense that it might actually become less costly to route a wire segment through a different metal layer rather than attempting to force it through on the same layer. This is accomplished by using one or more vias. A via connects one point of one metal layer to the same (x, y) location of a different (e.g., higher or lower) metal layer. For example, a via 1310 is shown whereby the metal at the present metal layer is connected to metal on an upper or lower metal layer. The connection is made to the same coordinate on the different metal layer. There may be upwards of eight to ten different metal layers in a semiconductor design. Congested passages may thereby be bypassed by routing to a different layer whose equivalent passages may be less congested. Of course, unnecessarily routing to a different metal layer is undesirable. Consequently, there is a given incremental cost associated with assigning metal segments to different metal layer(s). An example whereby a different metal layer is assigned is shown by wire segment 1309. The first portion of wire segment 1309 connects pin 1316 to via 1310. A second wire segment portion 1323 resides on a different vertical metal layer than that of wire segment 1322. Via 1310 connects one end of wire segment 1322 to one end of wire segment 1323. The other end of wire segment 1323 is connected to via 1311. Via 1311 connects wire segment 1323 to wire segment 1323. The reason for routing to a different metal layer may be to reduce congestion or to attain a lower cost path. Wire segment 1312 is connected on each end to vias 1311 and 1313 respectively. Via 1315 connects metal segment 1314 to wire segment 1324. Wire segment 1324 connects to pin 1317.

Figure 14:
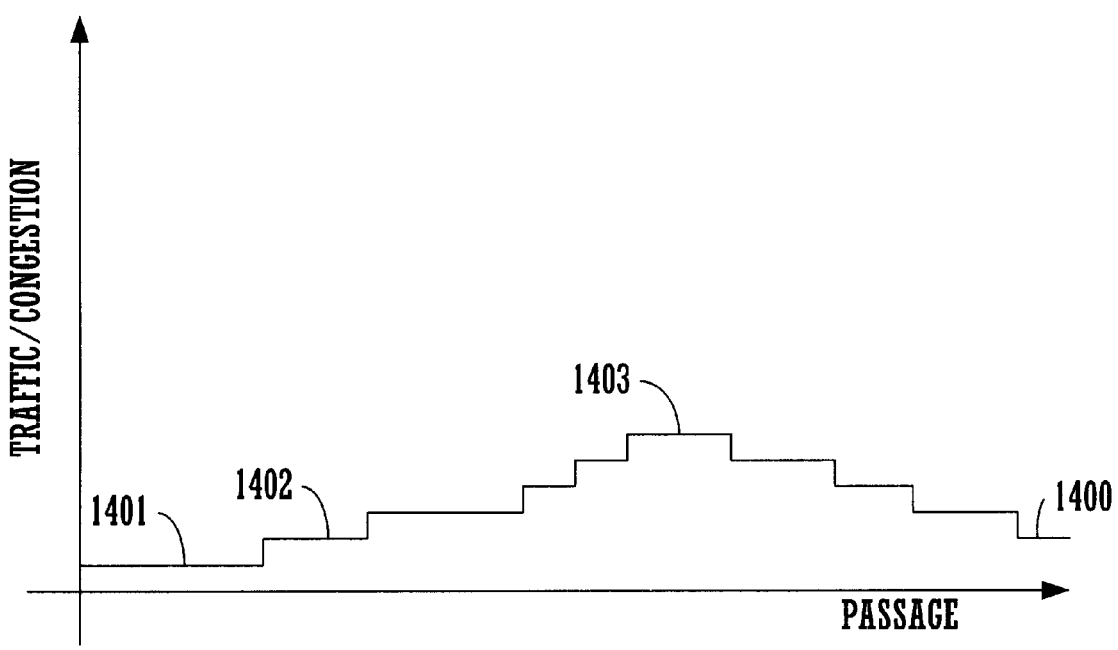
FIG. 14 shows an exemplary wiring density histogram.

In one embodiment of the present invention, a histogram is generated to determine the wiring density for each of the passages. FIG. 14 shows an exemplary wiring density histogram 1400. For example, suppose that a single wire is routed through part of the passage. This is represented by 1401. If a second wire segment is routed through a portion of the passage, the wire density for that portion having two wire segments, goes up as shown by 1402. Each wire segment routed through the passage successively increases its wiring density as shown by 1403. As the wiring density increases, the cost of routing additional wires through that particular passage increases. In other words, it becomes increasingly more and more costly to route wires through that particular passage. At some pre-determined cost threshold, wire segments are assigned to different metal layer(s).

Figure 15:
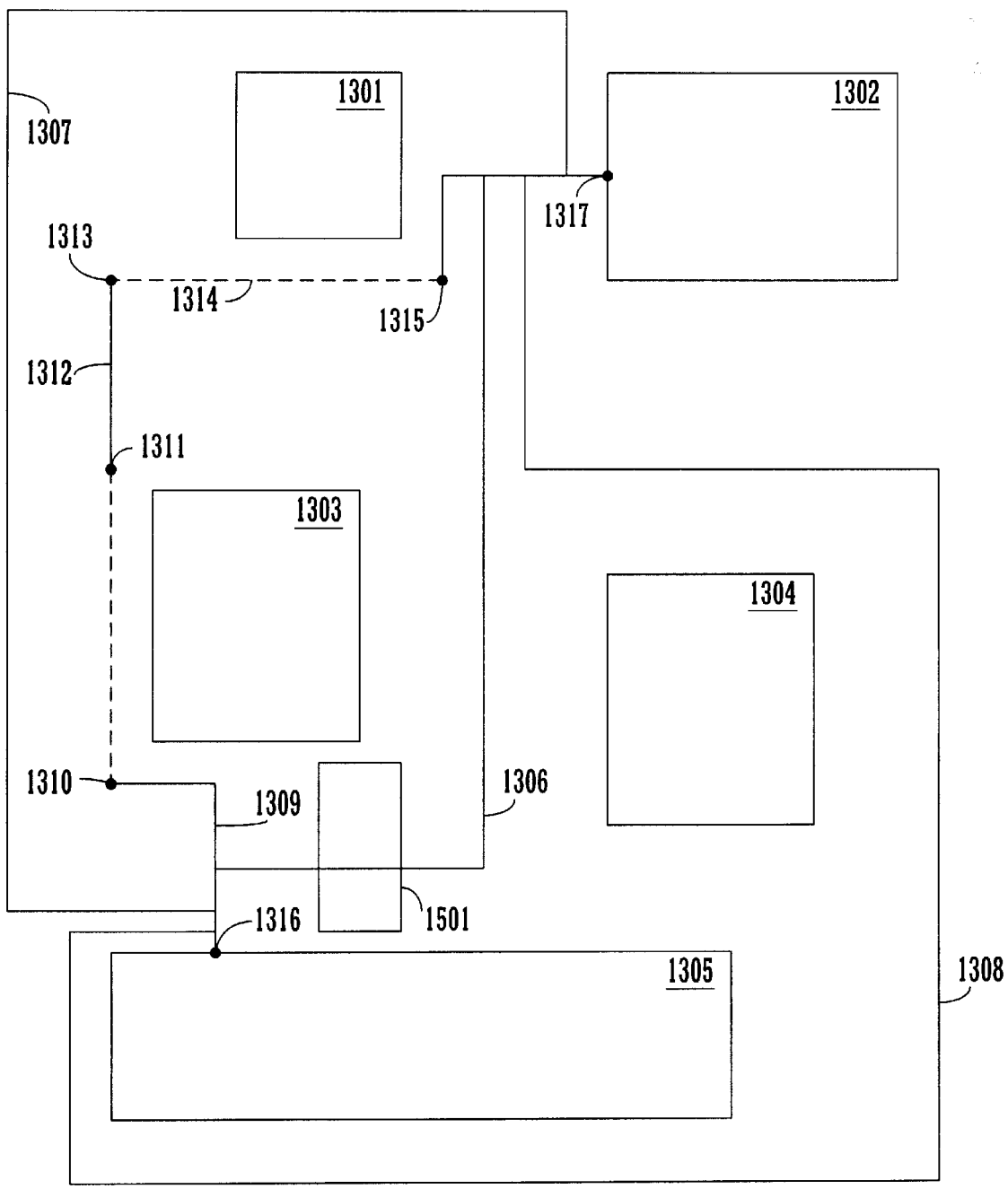
FIG. 15 shows a pseudo-obstruction.

As explained above, as the wiring density for a passage increases, at some point, it becomes impracticable to route additional wires through a portion or the entire passage. When this occurs, a soft pseudo-obstruction is artificially created. In other words, when a pre-set wiring density level is reached, the routing program determines the affected area. Thereupon, a virtual obstruction is created by the program. The effect of the pseudo-obstruction is to prevent wire segments from being routed through that area. It effectively sets aside a specific portion of a highly congested passage. Instead of routing wire segments through the pseudo-obstruction, the program would choose to route the wires segments around the pseudo-obstruction or to assign the wire segments to a different metal layer, depending on which path would result in the lowest cost. Referring to FIG. 15, a pseudo-obstruction 1501 is shown. Now, with the creation of pseudo-obstruction 1501, adding a new metal segment (e.g., metal 1306) would not be routed thorough that area.

Figure 16:
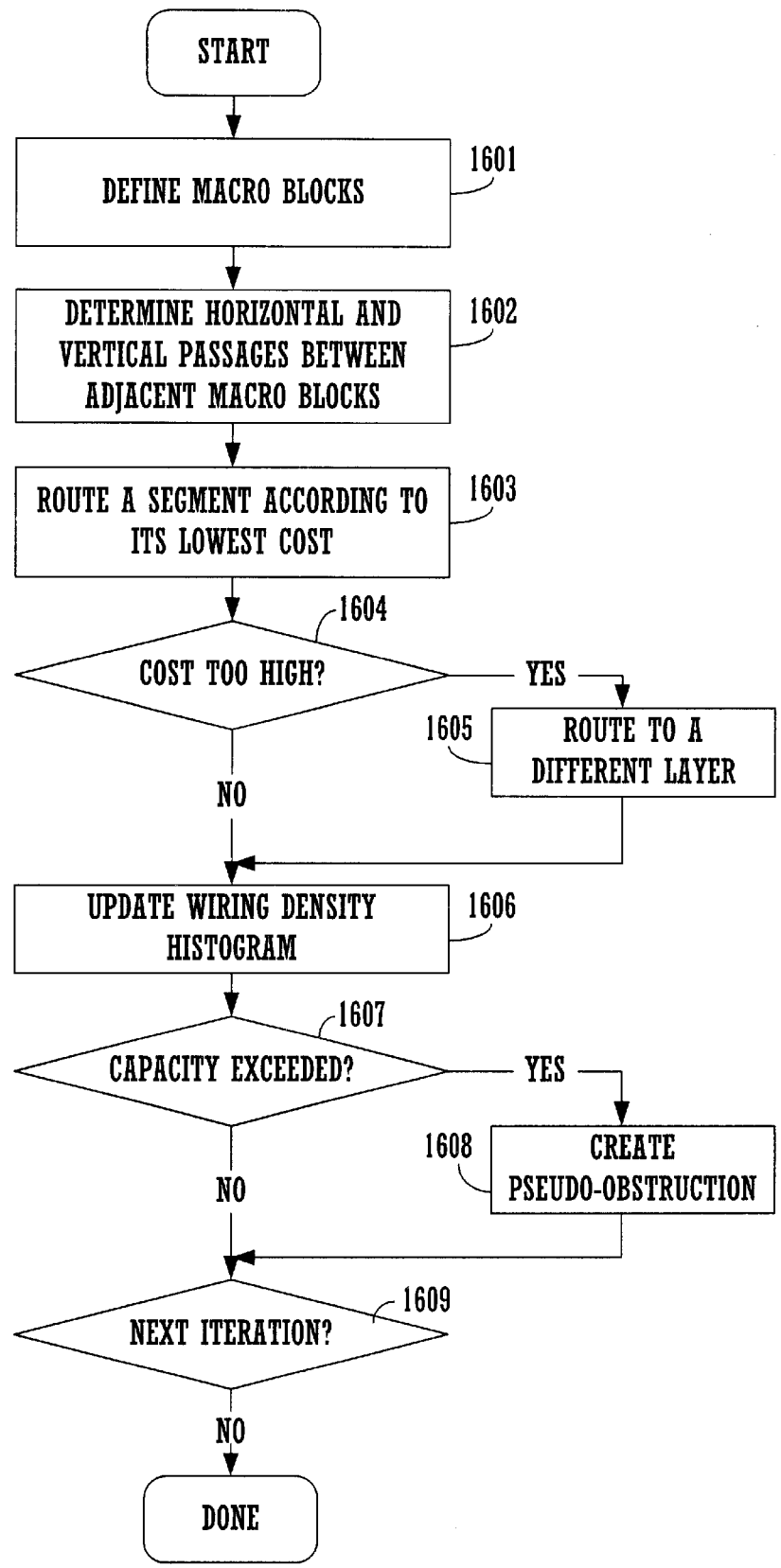
FIG. 16 is a flowchart describing the iterative, gridless, cost-based layer assignment process according to one embodiment of the present invention.

FIG. 16 is a flowchart describing the iterative, gridless, cost-based layer assignment process according to one embodiment of the present invention. Initially, one or more obstructions are defined, step 1601. Next, the horizontal and vertical passages between each of the obstructions and the edges are determined, step 1602. The distances separating adjacent obstructions and/or edges determines how much space is available through which wire segments can be routed. In step 1603, a wire segment is routed from one pin of a obstruction to another pin of another obstruction. The wire segment is routed according to the lowest cost path. This coarse routing is essentially the same as the detailed routing which was described above (e.g., gridless, pruning, searching, traceback, etc.). However, the routes do not become visible in this coarse trace. Furthermore, in coarse routing, lanes are not created per each edge; the same lane is used. The goal in coarse routing is not to separate each wire segment out for a clean route, but rather, to identify the available routing resources, examine the wiring density, and determine the most cost effective routing for that particular wire in terms of the passages/regions and lavers taken. And because there are fewer lanes to process, the coarse routing can be performed much more quickly; the number of lanes to be processed does not increase as more objects and signals are being routed.

Under certain circumstances, passages may become overly congested to the point whereby it becomes more cost effective to route the wiring segment to a different metal layer, steps 1604 and 1605. This is determined by consulting the wiring density histogram. After the most cost effective routing has been determined, the wiring density histogram is updated, step 1606. In other words, the wiring density histogram is updated each and every time a wire segment has been routed. A determination is made in step 1607 as to whether certain passages or portions have become so overly congested as to prevent further routing through that area. If so, the routing program creates a virtual pseudo-obstruction, step 1608. This pseudo-obstruction acts as an artificial obstruction. In step 1609, the process iteratively repeats for the next wire segment until routing for all pins have been completed.

CONCLUSION

The preferred embodiment of the present invention, an efficient iterative, gridless, cost-based fine routing process, is thus described. While the present invention has been described in particular embodiments, it should be appreciated that the present invention should not be construed as limited by such embodiments, but rather construed according to the below claims.

What is claimed is:

1. A computer controlled coarse routing method comprising the steps of:
    defining a plurality of obstructions, each of the obstructions having a plurality of pins;
    determining a plurality of areas existing between the obstructions through which wires may be routed;
    identifying a plurality of possible paths through which a wire may be routed to connect a pair of the pins;
    calculating costs corresponding to each of the possible paths;
    routing the wire to connect the plurality of pins according to the path having the lowest associated cost, wherein the routing method is operable to determine that the lowest cost path comprises routing a portion of the wire in at least two different metal layers;
    determining whether the wiring density corresponding to one of the areas has exceeded a threshold wiring density; and
    formulating a pseudo-macro for those areas which exceed the threshold.

2. The coarse routing method of claim 1, further comprising the steps of:
    generating a histogram as a function of wiring density for each of the plurality of areas;
    consulting the histogram when calculating the costs for the possible paths;
    updating the histogram when the wire has been routed.

3. The coarse routing method of claim 2, further comprising the step of:
    establishing a threshold wiring density.

4. The coarse routing method of claim 3, further comprising the steps of:
    a) producing a wire solution for an integrated circuit layout having a plurality of objects by traversing a plurality of source pin and target pin pairs and performing a gridless routing procedure to model a wire connection between each traversed source pin and target pin pair, said step a) comprising the steps of:
        a1) determining a first plurality of paths between a given source pin and a given target pin wherein each path comprises lanes, wherein said lanes reside in at least one of a plurality of layers of said integrated circuit layout;
        a2) pruning said first plurality of paths to produce a path subset, wherein said pruning is based on the location of a path of said plurality relative to an object of said plurality;
        a3) determining the lowest cost path of said path subset by applying a cost function to each path of said path subset wherein said cost function considers only objects within the same layer as each lane; and
        a4) modeling a wire connection between said source pin and said target pin based on said lowest cost path determined at step a3) wherein said wire connection is allowed to overlap with other wire connections and with selected objects;
        a5) repeating said step a1) through said step a4) for additional source pins and target pins;
    b) repeating step a) provided said wire solution contains less number of overlaps as a prior iteration of step a; and
    c) reporting the last computed wire solution as a final wire solution.

5. The coarse routing method as described in claim 4, wherein said step a2) comprises the steps of:
    determining an object of said plurality that defines a self lane having a parent lane;
    determining an intersection between said self lane and said parent lane;
    determining at least one child lane; and
    retaining only those child lanes that lie on a side of said object as defined with respect to said intersection.

6. The coarse routing method as described in claim 5 wherein, said side of said object as defined with respect to said intersection is the opposite side of said object as defined with respect to said intersection.

7. The coarse routing method as described in claim 6, wherein said step a2) further comprises the step of retaining as a valid child lane that lane that is defined by said object and lies on the same side of said object as said intersection.

8. The coarse routing method as described in claim 4, wherein said given source pin and said given target pin are part of a multi-pin net and wherein said step a3) comprises the steps of:
    determining a first path from said given source pin to said given target pin;
    determining a second path from said given source pin to said given target pin, said first and second paths having equal costs; and
    selecting as said lowest cost path, as between said first and second path, the path that comes closer to an unconnected pin that is also part of said multi-pin net.

9. The coarse routing method as described in claim 4, wherein said given source pin and said given target pin are part of a multi-pin net and further comprising the steps of:
    d) using steps a1) through a4) to model a wire connection between said given target pin and said given source pin;
    e) defining, as a target pin, an unconnected pin that is also part of said multi-pin net;
    f) defining said wire connection of said step d) as a source pin to said target pin of said step e); and
    g) repeating steps a1) through a4).

10. The coarse routing method as described in claim 4, wherein step a1) comprises determining self lanes and parent lanes and wherein a self lane is selected by several parent lanes, and wherein step a1) further comprises the steps of:
    for each parent lane selecting said self lane, computing a cost from said given source pin to an intersection of said parent lane to said self lane;

for each parent lane selecting said self lane, estimating a cost from its intersection to said given target pin;

for each parent lane selecting said self lane, determining its total cost by adding together its respective computed cost and its respective estimated cost;

selecting the lowest total cost and based thereon, inserting a single backpointer data structure on said self lane, said backpointer data structure containing said lowest total cost and a pointer to the parent lane having said lowest total cost.

11. The coarse routing method as described in claim 4 wherein said paths are represented by backpointer data structures inserted on lanes, said backpointer data structures comprising: a cost of reaching a lane from said given source pin; and a pointer to the ancestor of said lane and further comprising the step of determining a unique path by tracing through said backpointers starting from said respective target pin.

12. The coarse routing method as described in claim 11 wherein a first lane comprises several soft objects thereon that define a set of lane segments of said first lane and further comprising the step of defining a respective backpointer data structure for each lane segment of said first lane.

13. In a computer system comprising a processor coupled to a bus, a computer readable medium coupled to said bus and having stored thereon instructions that when executed implement a computer controlled routing method, said method comprising the steps of:

defining a plurality of obstructions, each of the obstructions having a plurality of pins;

determining a plurality of areas existing between the obstructions through which wires may be routed;

identifying a plurality of possible paths through which a wire may be routed to connect a pair of the pins;

calculating costs corresponding to each of the possible paths;

routing the wire to connect the plurality of pins according to the path having the lowest associated cost, wherein the routing method is operable to determine that the lowest cost path comprises routing a portion of the wire in at least two different metal layers;

determining whether the wiring density corresponding to one of the areas has exceeded a threshold wiring density; and formulating a pseudo-macro for those areas which exceed the threshold.

14. The computer readable medium of claim 13, wherein said method further comprises the steps of:

generating a histogram as a function of wiring density for each of the plurality of areas;

consulting the histogram when calculating the costs for the possible paths;

updating the histogram when the wire has been routed.

15. The computer readable medium of claim 13, wherein said method further comprises the steps of:

establishing a threshold wiring density.

16. The computer readable medium of claim 13, wherein said method further comprises the steps of:

a) producing a wire solution for an integrated circuit layout having a plurality of objects by traversing a plurality of source pin and target pin pairs and performing a gridless routing procedure to model a wire connection between each traversed source pin and target pin pair, said step a) comprising the steps of:

a1) determining a first plurality of paths between a given source pin and a given target pin wherein each path comprises lanes, wherein said lanes reside in at least one of a plurality of layers of said integrated circuit layout;

a2) pruning said first plurality of paths to produce a path subset, wherein said pruning is based on the location of a path of said plurality relative to an object of said plurality;

a3) determining the lowest cost path of said path subset by applying a cost function to each path of said path subset wherein said cost function considers only objects within the same layer as each lane; and a4) modeling a wire connection between said source pin and said target pin based on said lowest cost path determined at step a3) wherein said wire connection is allowed to overlap with other wire connections and with selected objects;

a5) repeating said step a1) through said step a4) for additional source pins and target pins;

b) repeating step a) provided said wire solution contains less number of overlaps as a prior iteration of step a; and c) reporting the last computed wire solution as a final wire solution.

17. The computer readable medium as described in claim 16, wherein said step a2) of said method comprises the steps of:

determining an object of said plurality that defines a self lane having a parent lane;

determining an intersection between said self lane and said parent lane;

determining at least one child lane; and retaining only those child lanes that lie on a side of said object as defined with respect to said intersection.

18. The computer readable medium as described in claim 17 wherein, said side of said object as defined with respect to said intersection is the opposite side of said object as defined with respect to said intersection.

19. The computer readable medium as described in claim 18, wherein said step a2) of said method further comprises the step of retaining as a valid child lane that lane that is defined by said object and lies on the same side of said object as said intersection.

20. The computer readable medium as described in claim 16, wherein said given source pin and said given target pin are part of a multi-pin net and wherein said step a3) of said method comprises the steps of:

determining a first path from said given source pin to said given target pin;

determining a second path from said given source pin to said given target pin, said first and second paths having equal costs; and selecting as said lowest cost path, as between said first and second path, the path that comes closer to an unconnected pin that is also part of said multipin net.

21. The computer readable medium as described in claim 16, wherein said given source pin and said given target pin are part of a multi-pin net and said method further comprises the steps of:

d) using steps a1) through a4) to model a wire connection between said given target pin and said given source pin;

e) defining, as a target pin, an unconnected pin that is also part of said multi-pin net;

f) defining said wire connection of said step d) as a source pin to said target pin of said step e); and g) repeating steps a1) through a4).

22. The computer readable medium as described in claim 16, wherein step a1) of said method comprises determining self lanes and parent lanes and wherein a self lane is selected by several parent lanes, and wherein step a1) of said method further comprises the steps of:

for each parent lane selecting said self lane, computing a cost from said given source pin to an intersection of said parent lane to said self lane;

for each parent lane selecting said self lane, estimating a cost from its intersection to said given target pin;

for each parent lane selecting said self lane, determining its total cost by adding together its respective computed cost and its respective estimated cost;

selecting the lowest total cost and based thereon, inserting a single backpointer data structure on said self lane, said backpointer data structure containing said lowest total cost and a pointer to the parent lane having said lowest total cost.

23. The computer readable medium as described in claim 16 wherein said paths are represented by backpointer data structures inserted on lanes, said backpointer data structures comprising: a cost of reaching a lane from said given source pin; and a pointer to the ancestor of said lane and further comprising the step of determining a unique path by tracing through said backpointers starting from said respective target pin.

24. The computer readable medium as described in claim 23 wherein a first lane comprises several soft objects thereon that define a set of lane segments of said first lane and further comprising the step of defining a respective backpointer data structure for each lane segment of said first lane.

* * * * *